(12) United States Patent
Achal et al.

(10) Patent No.: US 11,557,337 B2
(45) Date of Patent: Jan. 17, 2023

(54) LITHOGRAPHY FOR EDITABLE ATOMIC-SCALE DEVICES AND MEMORIES

(71) Applicants: National Research Council of Canada, Ottawa (CA); Quantum Silicon Inc., Edmonton (CA); The Governors of the University of Alberta, Edmonton (CA)

(72) Inventors: Roshan Achal, Edmonton (CA); Robert A. Wolkow, Edmonton (CA); Jason Pitters, Ottawa (CA); Martin Cloutier, Ottawa (CA); Mohammad Rashidi, Edmonton (CA); Marco Taucer, Edmonton (CA); Taleana Huff, Edmonton (CA)

(73) Assignees: National Research Council of Canada, Ottawa (CA); Quantum Silicon Inc., Edmonton (CA); The Governors of the University of Alberta, Edmonton (CA)

( * ) Notice: Subject to any disclaimer, the term of this patent is extended or adjusted under 35 U.S.C. 154(b) by 0 days.

(21) Appl. No.: 17/253,768

(22) PCT Filed: Jun. 19, 2019

(86) PCT No.: PCT/CA2019/050862
§ 371 (c)(1),
(2) Date: Dec. 18, 2020

(87) PCT Pub. No.: WO2019/241887
PCT Pub. Date: Dec. 26, 2019

(65) Prior Publication Data
US 2021/0272625 A1 Sep. 2, 2021

Related U.S. Application Data

(60) Provisional application No. 62/686,754, filed on Jun. 19, 2018.

(51) Int. Cl.
*G11C 13/02* (2006.01)
*G11C 11/44* (2006.01)
*H01L 39/22* (2006.01)

(52) U.S. Cl.
CPC ............ *G11C 11/44* (2013.01); *H01L 39/221* (2013.01); *H01L 2224/0391* (2013.01)

(58) Field of Classification Search
CPC ..... G11C 11/44; G11C 11/56; G11C 13/0009; G11C 13/02; H01L 39/221; H01L 2224/0391
See application file for complete search history.

(56) References Cited

U.S. PATENT DOCUMENTS

2020/0044150 A1* 2/2020 C ...................... H01L 29/66439

FOREIGN PATENT DOCUMENTS

CN 101872746 A 10/2010
CN 102969268 B 6/2015
(Continued)

OTHER PUBLICATIONS

Godlewski et al. Interaction of a conjugated polyaromatic molecule with a single dangling bond quantum dot on a hydrogenated semiconductor. Jan. 5, 2016. Physical Chemistry Chemical Physics, 18, 3854-3861. (Year: 2016).*

(Continued)

*Primary Examiner* — Hoang-Quan Ho
(74) *Attorney, Agent, or Firm* — Blue Filament Law PLLC

(57) ABSTRACT

An atomic orbital based memory storage is provided that includes a plurality of surface atoms forming dangling bonds (DBs) and a subset of the plurality of surface atoms passivated with spatial control to form covalent bonds with hydrogen, deuterium, or a combination thereof. The atomic orbital based data storage that can be rewritten and corrected (Continued)

as needed. The resulting data storage is also archival and capable of high data densities than any known storage as the data is retained in a binary storage or a given orbital being passivated or a dangling bond (DB). A method of forming and reading the atomic orbital data storage is also provided. The method including selectively removing covalent bonds to form dangling bonds (DBs) extending from a surface atom by hydrogen lithography and imaging the covalent bonds spatially to read the atomic orbital data storage.

25 Claims, 21 Drawing Sheets

(56) References Cited

FOREIGN PATENT DOCUMENTS

| KR | 20050122646 A | 12/2005 | | |
|---|---|---|---|---|
| WO | 2018015809 A2 | 1/2018 | | |
| WO | WO-2018015809 A2 * | 1/2018 | ....... | H01L 29/66439 |

OTHER PUBLICATIONS

Int'l Search Report for PCT/CA2019/050862, dated Sep. 3, 2019.

* cited by examiner

FIG. 7B
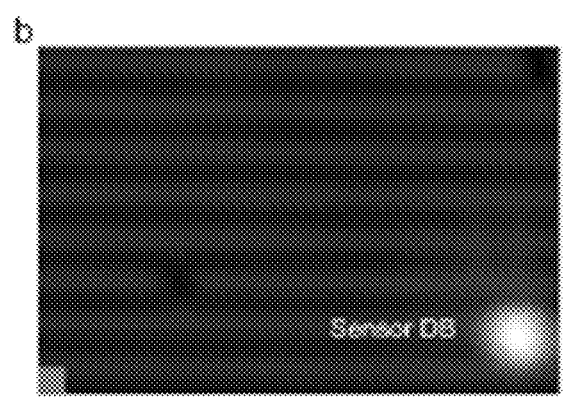
FIG. 7C
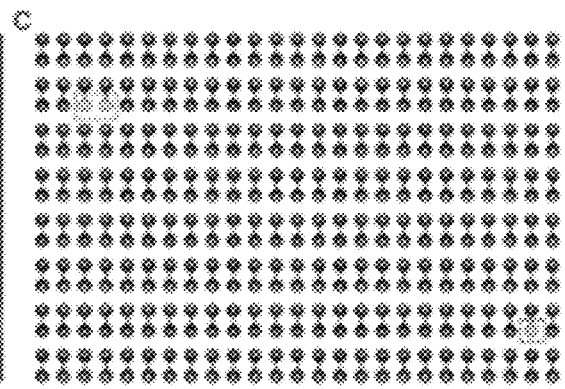
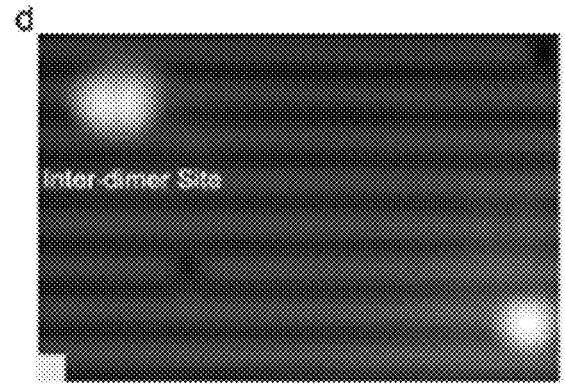
FIG. 7D
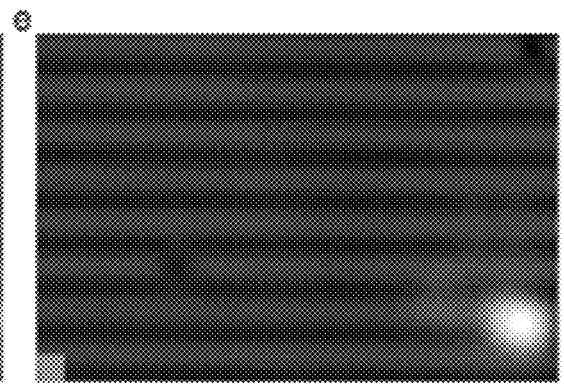
FIG. 7E

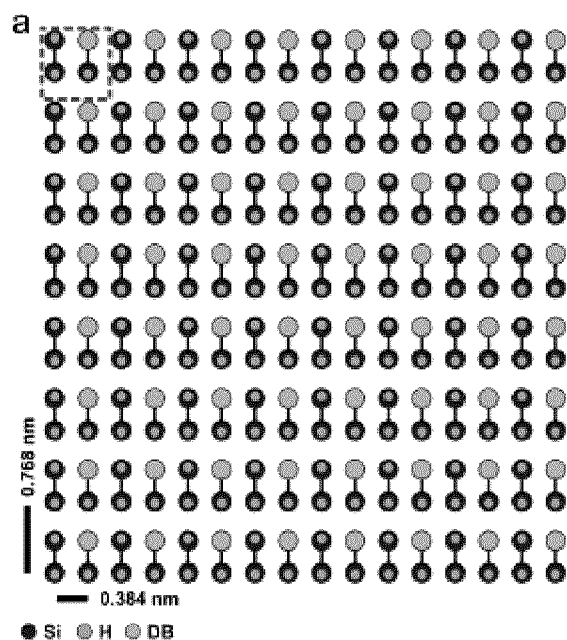
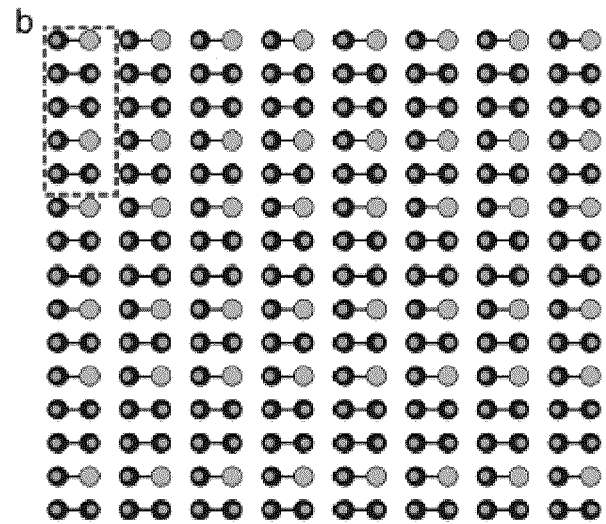
FIG. 11A    FIG. 11B
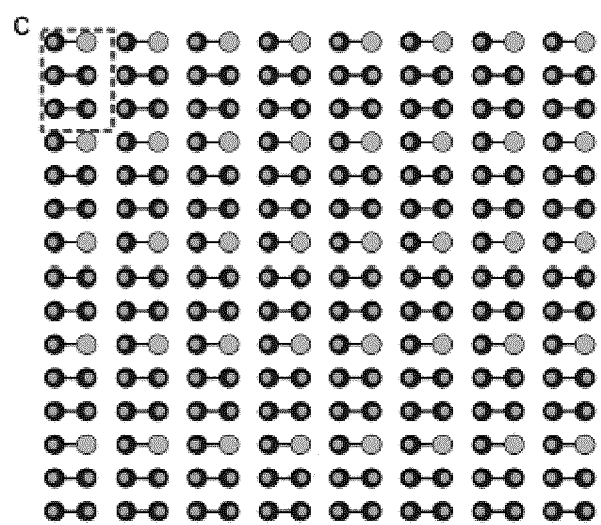
FIG. 11C

LITHOGRAPHY FOR EDITABLE ATOMIC-SCALE DEVICES AND MEMORIES

The present invention generally relates to atomic orbital based data storage, and in particular to surface atom based devices for editable data storage and memory.

BACKGROUND

The integration of molecules into electronic devices is a topic of increasing interest as the end of the current silicon technological roadmap draws even closer. Molecules can exhibit an array of properties, which can add specific functionality to a given device. Many applications of molecular electronics have been both proposed and demonstrated, including their use as sensors, as diodes, and even in the physical actuation of molecule-based logic structures. There is a particular focus on the integration of molecules on silicon surfaces to complement and enhance existing technologies. The benefit of a complementary approach to augment rather than replace silicon is that the vast knowledge and infrastructure currently available need not be abandoned altogether. The reactivity of a number of molecules with the silicon surface has been studied to date including simple cases like hydrogen, or more complex alkenes. By partially passivating the silicon surface with hydrogen, the reactivity of certain sites on the surface was found to change. With a fully hydrogen-passivated surface, it was later shown that it was possible to remove hydrogen atoms in particular geometries to spatially control reactions with single molecules in chemical molds. In an advanced demonstration, a single site tailored to react with phosphine molecules was created on a hydrogen-passivated silicon surface. By then exposing the surface to phosphine gas, the reaction at the site enabled the controlled placement of a single phosphorus dopant atom to create a single atom transistor and two coupled qubits.

Studying site-selective chemistry on silicon such as this is a lucrative avenue to gain a better understanding of reaction mechanisms and dynamics at the single molecule level, as well as to test the reliability of theoretical predictions of tailor-made reactive sites. The reaction pathway for hydrogen molecules on the silicon surface for instance was highly debated between the inter-dimer and intra-dimer pathways. It was eventually shown that the inter-dimer pathway was the dominant one, corroborated by theoretical calculations, which predicted it to be barrierless. These results relied on the observation of many naturally occurring sites on the surface using a scanning tunneling microscope (STM). With progress in hydrogen lithography on the hydrogen-passivated silicon surface (i.e. the removal of hydrogen atoms), it is now possible to reliably create arbitrarily complex sites on the surface, including both the inter- and intra-dimer sites. Given the ability to now intentionally create both types of sites in the same area, the debate might have been settled sooner. This further opens the possibility of studying the effect of nearby surface defects and charged species on the reactivity of otherwise identically created sites. Local variations are an important consideration at the nanoscale as defects can cause non-uniform electrostatic landscapes, which can affect the behavior of atomic-scale devices.

Typical STM-based dynamics studies, to observe the motion and state of molecules or sites, are somewhat limited, however, as they involve sequential scans over an area. Real-time observations are difficult because the intervals between scans are often many seconds to minutes apart. Further, there is the influence of the STM tip as it scans over the entire area, which can deposit material or strongly influence any local dynamics due to the injection/removal of charge. The latter aspect can complicate the interpretation of the amount of local charge in an area or structure on the surface. It is possible to determine the exact charge of defects with an STM in specific systems, through careful analysis and comparison to theory. Other techniques to measure the charge of defects and structures include using an atomic force microscope (AFM), where observations can be made almost free of fields.

Interest in atomic memory has been reignited with foundational work on chlorine-passivated Cu(100), establishing a sophisticated scanned probe architecture to create a kilobyte of memory from surface vacancies, without the need to vertically manipulate atoms. (Kalff et al.) The memory operates near 77 K, where it remains stable for at least 44 hours. (Ibid) There are several key features of dangling bond (DB)-based memories that allow us to push atomic-scale storage even further than this already substantial progress. Patterned DB structures exhibit improved thermal stability, remaining stable for an additional 400 K above liquid nitrogen temperature. (McEllistrem et al., Schwalb et al.) The maximum storage density of memory blocks can be increased by 32%, as DBs can be placed in close proximity to one another. In addition to density, the number of available bits is not predetermined at the time of sample preparation. (Kalff et al.) DBs can now be created or removed as needed using hydrogen lithography (HL) and hydrogen repassivation (HR) (assuming a sufficient supply of hydrogen atoms), theoretically allowing the entire hydrogen-terminated surface to be written to. Creating additional vacancies/bits in the Cu(100) system is currently not possible without damaging the STM tip. (Ibid) Furthermore, a semiconducting substrate as opposed to a metallic one opens the possibility of interfacing with integrated electronics, whether at the atomic-scale or using more conventional nanofabrication.

Thus, there exists a need for a device to store information in the DBs extending from a surface. There further exists a need to be able to rewrite such storage or correct archival errors therein.

SUMMARY OF THE INVENTION

An atomic orbital based memory storage is provided that includes a plurality of surface atoms forming dangling bonds (DBs) and a subset of the plurality of surface atoms passivated with spatial control to form covalent bonds with hydrogen, deuterium, or a combination thereof. The atomic orbital based data storage that can be rewritten and corrected as needed. The resulting data storage is also archival and capable of higher data densities than any known storage as the data is retained in a binary storage or a given orbital being passivated or a dangling bond (DB). A method of forming and reading the atomic orbital data storage is also provided. The method includes selectively removing covalent bonds to form dangling bonds (DBs) extending from a surface atoms by hydrogen lithography and imaging the covalent bonds spatially to read the atomic orbital data storage.

BRIEF DESCRIPTION OF THE DRAWINGS

FIG. 7B is an STM image (V=−1.6 V, I=50 pA, T=4.5 K, 11.3×7 nm$^2$) taken of the area around a sensor DB exhibiting a sharp current onset in its I/V spectrum;

FIG. 7C shows the geometry of the surface, showing the location where an inter-dimer site has been created from DBs (red rectangle), and the sensor DB (red square);

FIG. 7D is an STM image (V=−1.6 V, I=50 pA, T=4.5 K, 11.3×7 nm$^2$) after the creation of an inter-dimer site 10.2 nm from the sensor DB;

FIG. 7E is an STM image (V=−1.6 V, I=50 pA, T=4.5 K, 11.3×7 nm$^2$) after hydrogen gas was added into the vacuum chamber, and the reaction of a hydrogen molecule with the inter-dimer site was detected by a shift in the I/V spectrum taken over the sensor DB;

FIG. 11A is an ultra-dense atomic memory design according to embodiments of the present disclosure with the original design of the ultra-dense memory array created from dangling bonds (DBs), with a maximum bit density of 1.7 bits per $nm^2$, the unit memory cell is denoted in the dashed line box, containing one bit, with this memory designed to be rewritten by bringing in external hydrogen atoms on a probe tip, which presented a potential bottleneck for the speed of rewriting operations;

FIG. 11B is an ultra-dense atomic memory design according to embodiments of the present disclosure, with a maximum storage density of 1.36 bits per $nm^2$ with the memory cell denoted in the dashed line box containing two bits, where each bit within the cell can be rewritten by converting the DB into an inter-dimer site, which subsequently reacts with an ambient molecule of hydrogen, removing the need to bring in hydrogen atoms externally;

FIG. 11C is an ultra-dense atomic memory design according to embodiments of the present disclosure having a less dense array design with a maximum bit density of 1.13 bits per $nm^2$ with the memory cell denoted in the dashed line box containing one bit, where each bit can also be rewritten through molecular hydrogen repassivation, with a more analogous geometry to that of FIG. 11A;

DETAILED DESCRIPTION OF THE INVENTION

Figure 1A:
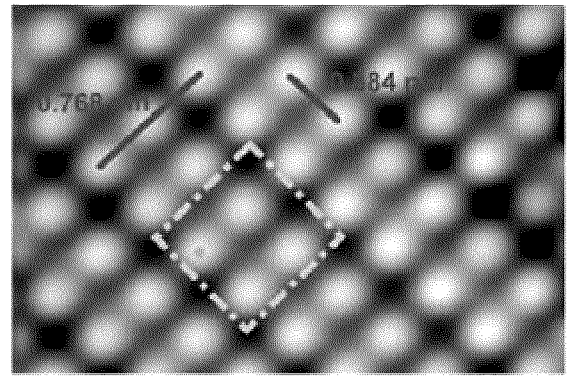
FIGS. 1A-1E show surface geometry of hydrogen-passivated Si(100)-2×1 according to embodiments of the present invention.

The present invention has utility as atomic orbital based data storage that can be rewritten and corrected as needed. The resulting data storage is also archival and capable of high data densities than any known storage as the data is retained in a binary storage or a given orbital being passivated or a dangling bond (DB).

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

While the present invention is further detailed with respect to DBs on a silicon surface, it is appreciated that other such materials operative herein illustratively include most semiconductor and compound semiconductor materials such as germanium, diamond, graphite, graphene, GaAs, InSb, transition metal chalcogenides, and thin insulator-on-conductor and thin insulator-on-semiconductor surfaces.

In a binary lithography mode, of either only (surface atom)—H or (surface atom)—D bonds, bit densities of 1.7 bits/$nm^2$ or higher are achieved. According to embodiments, various bit densities are provided. That is bit densities of 1 to 25 bits per $nm^2$ are achieved.

An attribute of the present invention is that with a passivating overlayer, the storage created according to the present invention is archival stable storage and can retain the stored positionally based information indefinitely. Passivating overlayers operative herein illustratively include a graphene overlayer, any of many molecular films composed mainly of saturated organic components, or a capping wafer bound to the first silicon wafer (the atoms would be patterned on plateaus surrounded by a continuous ridge (a flat-bottomed valley)) so that a capping wafer would not touch the silicon surface. This contrasts with digital memory that is both energy intensive and prone to environmental degradation. It is appreciated that there may be electron holographic modes of readout that allow for the graphene or other molecular overlayers to be permanently left in place, even during electron readout.

According to the present invention, hydrogen lithography (HL) is used to modify a surface atom to store information as a function of whether a given dangling bond (DB) is reacted to form a covalent bond with hydrogen. The ability to control the covalent bonding of a DB requires only that a surface atom have fewer bonding partners than is normal for that element with the non-partnered orbital forming the DB. For example, a silicon atom, which would ordinarily share in four bonds, can be charged controllably if it is restricted to participating in only three bonds. That situation is achieved naturally at the surface of a silicon crystal where each surface atom has a three-coordinate bonded. By spatially controlled HL, a single chargeable atom is created by bonding all but one surface silicon atom to a hydrogen atom, such that all surface silicon atoms share in three silicon-silicon bonds and one Si—H bond. By forming multiple such DBs in spatially controlled proximity or selective Si—H bond formation, information is readily stored.

To begin automated HL, the location of every hydrogen atom in a select area is determined for accurate STM tip registration during fabrication. Slight errors in the tip position can result in incorrect atoms being removed. Fast, fully autonomous lithography also requires the location of each atom to be known, such that the surface does not need to be reimaged after each removal event to determine the next site. The periodicity of the hydrogen-passivated Si(100)-2×1 surface, show in FIG. 1A, permits the location of every hydrogen atom to be determined from a single STM image (while accounting for nonlinearities in the scanner) through the use of Fourier analysis, as shown in FIGS. 1A-1F. Such an analysis is relatively immune to the presence of small surface defects and dangling bonds due to their spatially localized nature in the images compared to the extended periodicity of the surface itself. FIGS. 1A-1F illustrate the basic features of this process.

Figure 1B:
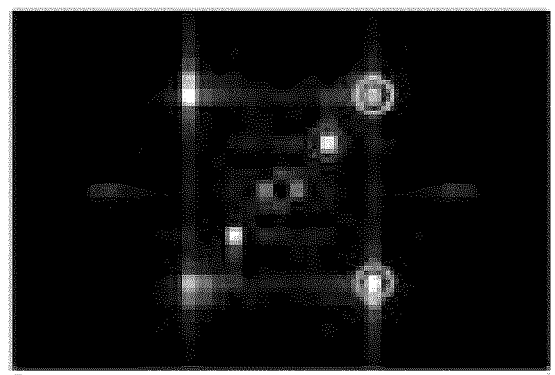
Figure 1C:
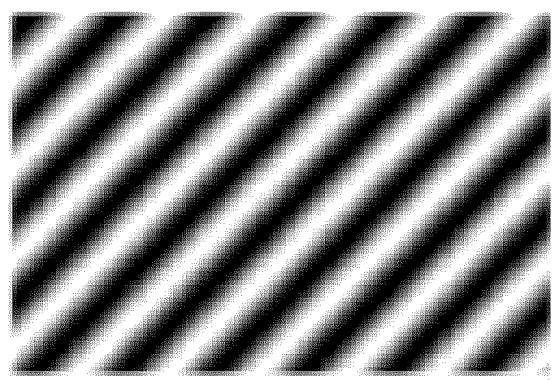
Figure 1D:
Figure 1E:
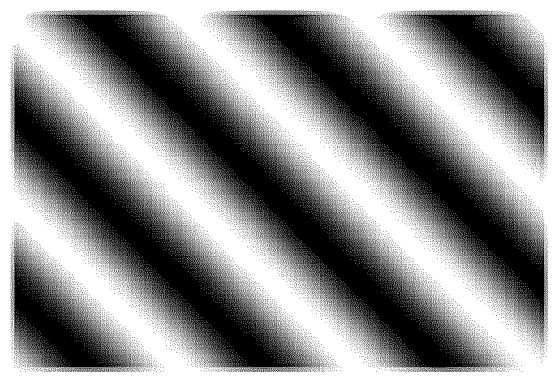
Figure 1F:
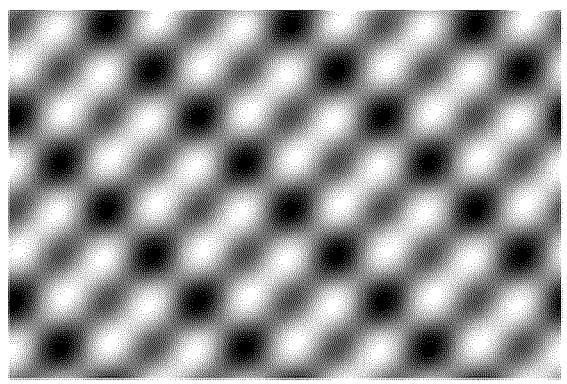

That is, FIG. 1A shows an STM image of hydrogen atoms bonded to the Si(100)-2×1 surface. The distance between identical sites along and across a dimer row are shown in red (solid). The surface geometry allows for the creation of single atom bits at ultra-high densities. The area of one bit (including spaces between atoms), 0.590 $nm^2$, is outlined in yellow (dashed), and is defined as a binary zero. The hydrogen atom denoted with a dot (blue) is removed with an STM tip to create a DB, changing the bit to a binary one. FIG. 1B shows a 2D Fourier transform (power spectrum) of the image of FIG. 1A, where the three dominant spatial frequencies have been isolated. FIGS. 1C-1E show filtered STM images of the image of FIG. 1A, for each dominant frequency shown in FIG. 1B, (FIG. 1C=bottom frequency (blue), FIG. 1D=top frequency (yellow), FIG. 1E=middle frequency (red)). FIG. 1F shows the resulting image from the sum of frequencies shown in FIGS. 1C-1E, reconstructing the essential features of the STM image shown in FIG. 1A, allowing for the position of each surface hydrogen atom to be determined.

In practice, images between 10×10 nm2 to 40×40 nm$^2$ are used to determine the location of the hydrogen atoms on a given sample terrace. Once the surface has been characterized, the desired pattern is mapped onto the lattice. Next, the tip is brought over each lattice site of the pattern and 20 ms voltage pulses between 1.8 and 3.0 V are applied at a fixed tip-height (V=1.4 V, I=50 pA) until the successful removal of hydrogen has been detected. FIGS. 2A-2E show the process of building DB structures with HL while using HR to correct errors.

Figure 2A:
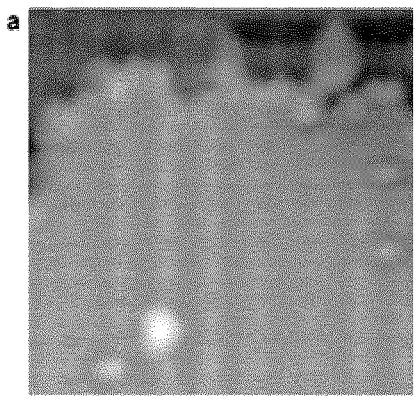
FIGS. 2A-2E show fabrication and correction on hydrogen-terminated Si(100)-2×1 via HL and HR according to embodiments of the present invention.
Figure 2B:
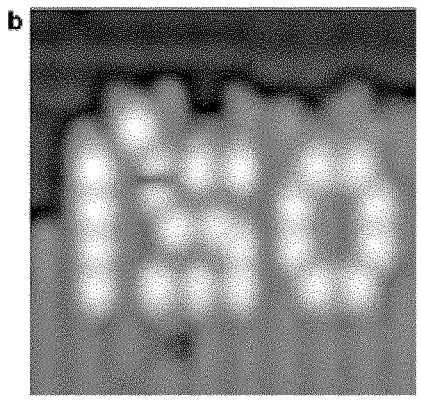
Figure 2C:
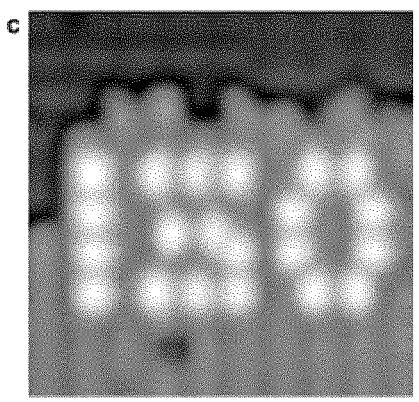
Figure 2D:
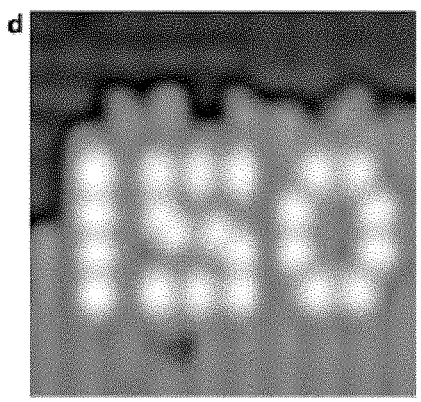
Figure 2E:
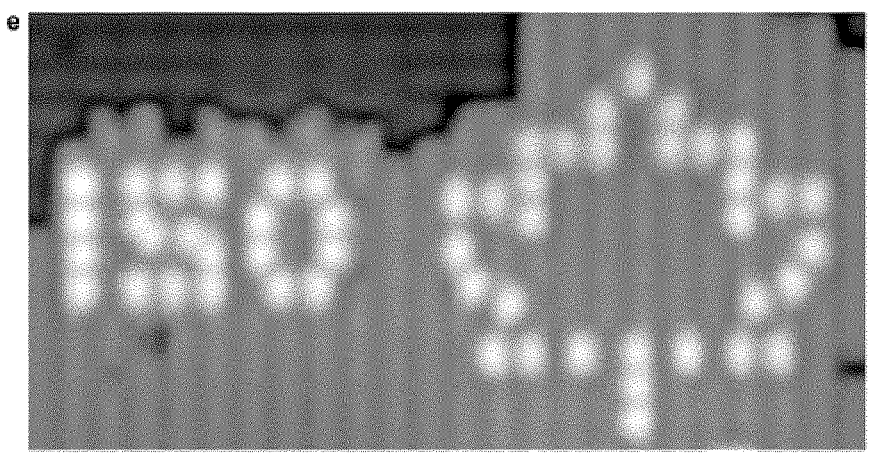

That is, FIG. 2A shows an STM image of the fabrication area used to determine the location of each hydrogen atom through Fourier image analysis. FIG. 2B shows V=−1.7 V, I=50 pA, T=4.5 K, 10×10 nm$^2$ fabrication of the characters "150" using HL, one atom has been removed in error above the characters and one atom is incorrectly placed inside the "5". The created DBs appear as bright protrusions. FIGS. 2C and 2D show images created using the HR technique, in which the errors of FIG. 2B were subsequently erased, then the correct hydrogen atoms were removed with HL to create an error-free structure. FIG. 2E shows V=−1.7 V, I=50 pA, T=4.5 K, 11×21 nm2, with the completed structure of 54 DBs, depicting the characters "150" and a maple leaf. Unlike conventional HL, the STM feedback control is disabled during the voltage pulses. This allows jumps in the tunneling current to be used as an indicator of success, which can be detected faster and more accurately than jumps in tip-height through the feedback circuitry.

Using this procedure, the probability of detrimental uncontrolled apex changes is low. By beginning removal attempts at 1.8 V, higher voltages, which are more likely to change or damage the tip, are only reached when necessary. Conservatively, on the order of 10 DBs can be created consecutively without some type of minor modification to the tip. However, it has been found that HL efficiency is not particularly sensitive to minor changes of the tip, so the actual number of DBs that can be created without altering removal efficiency during fabrication is often larger. Should the tip change so much that it is no longer suitable for HL purposes, an automated tip forming routine is initiated to recondition the tip through controlled contact with the surface. This routine takes advantage of a machine learning algorithm, and STM image data for training sets, to automatically identify the quality of the probe by imaging a DB, initiating reconditioning when necessary.

An important consideration inherent in all scanned probe lithography is the existence of thermal drift and creep, both of which can also cause uncertainty in the position of the tip, leading to errors. At 4.5 K these factors are well controlled by allowing the STM to stabilize over a period of several hours. However, at warmer temperatures or in situations where allowing the STM to stabilize is not an option, a more active solution is required. According to embodiments, the device and method provided by the present disclosure is operative over a broad range of temperatures, including 0 to 100 degrees Celsius. To address these factors, periodic image realignments are implemented into the HL workflow. Before initiating the HL procedure, an area near the lithography location (~10×10 nm2) is imaged as a reference. After a set time, lithography is paused, and this area is reimaged to determine how much the tip has been offset from its intended position due to creep and drift. The remaining sites in the pattern are shifted appropriately to compensate and lithography resumes. The effectiveness of this realignment can be increased by reducing the interval between reference checks, permitting an optimization between speed and accuracy depending on a given application. Without realignment the lithographic accuracy during HL using a non-stabilized STM was near 35% for a particular structure. Under the same conditions using moderate active realignment it was over 85%, which is within a suitable range to then correct the remaining errors using HR.

Hydrogen repassivation (HR) is then used to overwrite or correct a storage area in a spatial array of DBs. Still higher information storage densities are achieved by also using Deuterium (D) atoms to create a ternary storage system in which a given atom exists as a DB, Si—H, or Si-D.

To correct errors, the STM tip is used to address individual lattice sites with atomic precision to repassivate select DBs. Ab initio calculations reveal that certain silicon terminated tips with a hydrogen atom bonded to the apex (functionalized) are capable of repassivating DBs. Through controlled contact of the STM tip with the surface during tip-conditioning, silicon atoms may become affixed to the tip to form the necessary structure for HR. When the tip becomes functionalized with a hydrogen atom there is a change in STM imaging resolution. With a functionalized tip, the first step of HR is to position it over a DB at a sample voltage of 1.4 V and current of 50 pA. The feedback control is then disabled, and the sample voltage is changed to a value between 100 mV and 1.0 V. While recording the tunneling current, the STM tip is brought 500 to 800 pm towards the sample, then is retracted to its original position. The voltage is reset to the original value of 1.4 V and the feedback control is restored. This entire process, once a user has selected a site, has been automated, taking ~1 s. It can be initiated at the press of a button and repeated until a successful repassivation signature is observed. According to embodiments, this new HR process is integrated within the HL workflow to enable fully autonomous fabrication and correction. Errors are automatically detected via image recognition, and subsequently corrected using the HR technique.

Figures 3A, 3B, 3C:
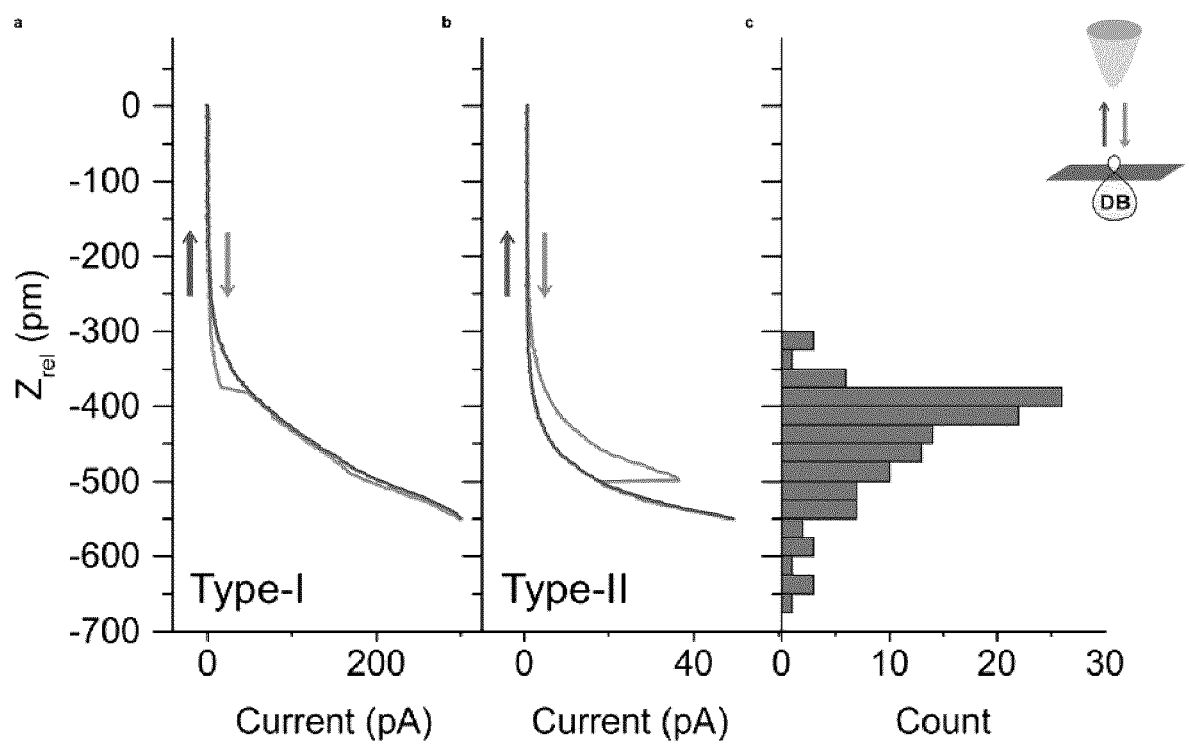
FIGS. 3A-3C are graphs showing tunneling current signatures of HR and the number of successful HR events with tip approach distance.

A necessary element for the implementation of fully automated HR is the existence of a reproducible, easily distinguished, signature indicative of successful repassivation, much like the jump in tunneling current used during HL. A sudden increase in the tunneling current is usually observed while approaching the surface when a DB is successfully repassivated that is not present as the tip retracts, as shown in FIG. 3A. FIG. 3A shows (V=0.4 V, T=4.5 K) the recorded tunneling current as the STM tip (set over a DB at 1.4 V and 50 pA) that is brought towards the surface (blue) and as the STM tip is retracted (red) during HR. A sudden increase as the tip approaches the surface can be observed in the tunneling current (blue), indicating a successful HR event. This signature (type-I) is typically associated with a change in STM imaging resolution, and a removal of hydrogen from the tip apex. The measured current is related to the overlap of the imaging orbital of the tip, and orbitals of features on the surface. This signature (type-I) is associated with the removal of a hydrogen at the tip apex and a return to pre-hydrogen-functionalized imaging resolution. The increase in current is due to the new apex orbital having a larger spatial extent, creating a greater overlap between the tip and sample surface compared to that between a DB and a hydrogen-functionalized tip (held at the same tip-sample separation).

Figure 4A:
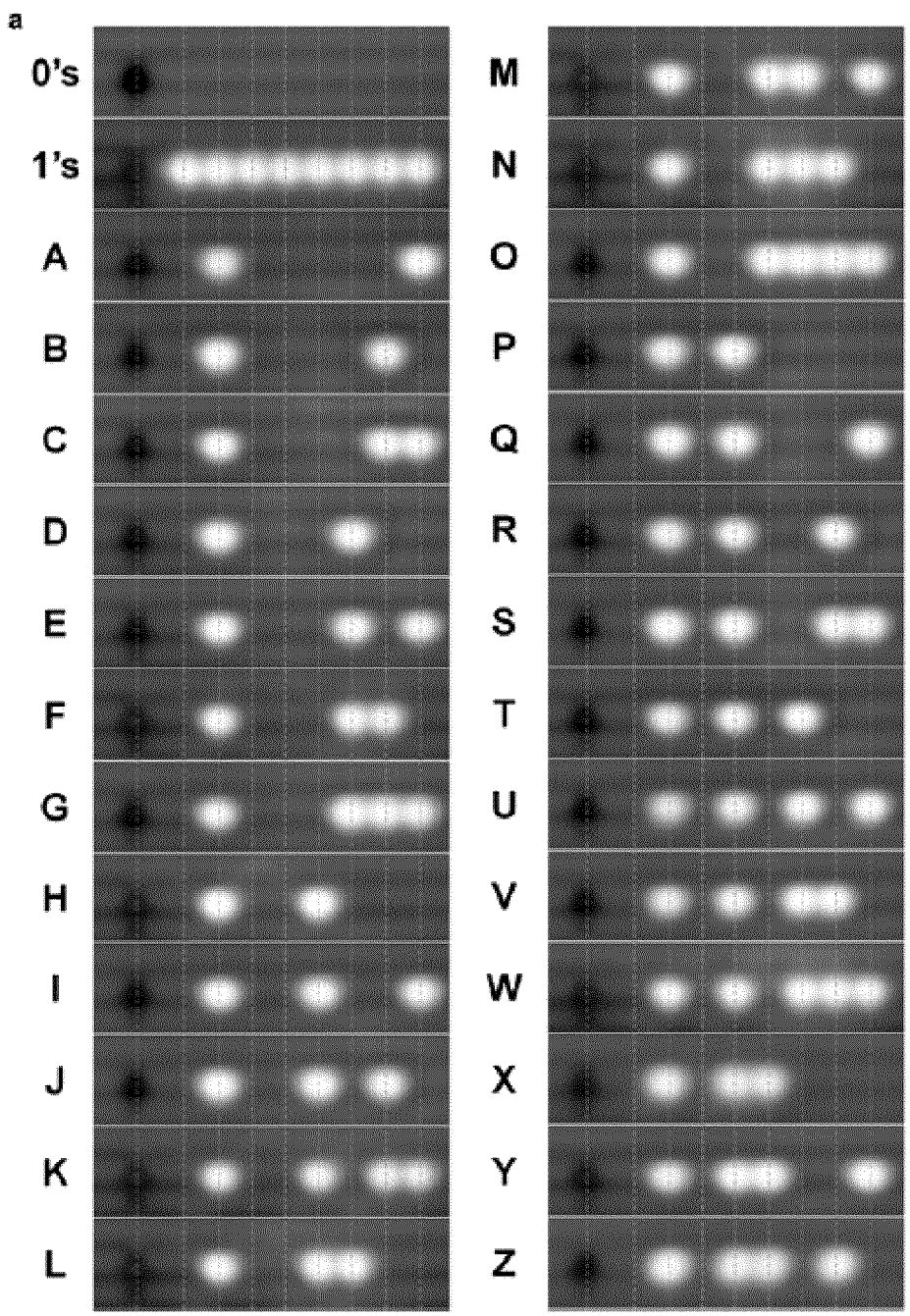
FIGS. 4A and 4B respectively show 8-bit and 192-bit atomic rewritable memories according to embodiments of the present invention.

Following the same HR procedure with a tip that is not functionalized, it is also possible to repassivate DBs with no associated change in imaging resolution. Since STM imaging resolution is particularly sensitive to changes in the tip apex orbital, it is assumed that the imaging orbital is unchanged and that the hydrogen atom comes from the off-apex region. In addition to functionalization there are several mechanisms through which atomic hydrogen may be available on the (off-apex) surface of a tip for HR. The surface of silicon terminated tips can become passivated with hydrogen, allowing atomic hydrogen to physisorb on top. If the tip is not silicon terminated, it has been shown that hydrogen is also capable of physisorbing on the surface of some metallic tips. Since the precise structure of the tip is unknown, the available hydrogen on the tip is likely due to a combination of these mechanisms. According to embodiments, the STM tip can be loaded with hydrogen atoms through the creation of several DBs (far from the current structure) using HL. An average of three DBs (to a maximum of five) are repassivated successively, without the need to load the tip with additional hydrogen, as shown in FIG. 4A. FIG. 4A shows (V=−1.75 V, I=50 pA, T=4.5 K, 3.3×10 nm2) STM images of a rewritable 8-bit memory constructed from DBs. The DBs appear as bright protrusions in the images, the black defect is an area of missing silicon. The letters of the English alphabet were converted to their ASCII binary forms (e.g. A=01000001) and written to the same area using HL and HR techniques. An average of three bits could be repassivated sequentially between the letters shown. During HR, when the DB is repassivated with an off-apex hydrogen a second signature in the tunneling current (type-II) is observed as a sudden decrease, as in FIG. 3B, which is also observed during HR at 77 K. FIG. 3B shows (V=0.2 V) a second distinct signature (type-II) observed during HR, with a sudden decrease in tunneling current during the approach towards the surface (blue). This type-II signature is not typically associated with a change in STM imaging resolution.

The sudden drop in current is due to a reduction in overlap between the tip and sample. DBs appear as bright protrusions on the sample surface compared to the surrounding hydrogen (orbital more spatially extended towards tip). There is a decrease in the size of the surface orbital after the DB has been repassivated, which reduces overlap/current, as the tip orbital remains unaltered.

Unlike the type-I process, which theoretically relies on a particular tip state to enable the transfer of hydrogen, the type-II process appears to be much less restrictive. Type-II HR events have been observed even after impressing the tip ~1 nm into the sample surface. Both processes have been observed and reproduced on a number of physically different tungsten tips, during the fabrication of numerous different structures. The structures in FIGS. 2A-2E and FIGS. 4A and 4B were created using different tips for example. The location of type-I and type-II signatures are recorded in the tunneling current for 119 successful HR events collected using seven different tips. FIG. 3C shows the distribution of distances the tip traveled towards the surface for HR to occur. That is, the tip approach distance where either signature occurred is recorded for 119 unique HR events. Nearly 90% of events occur before 550 pm. The inset of FIG. 3C depicts the STM tip approaching a DB on the surface. The majority of events (~90%) occur before moving 550 pm. Closer tip approaches have an increased tendency to change the tip structure. This value provides an ideal parameter for fully automated HR, optimizing the probability of repassivation while mitigating that of harmful apex changes.

According to embodiments, when a tip is hydrogen-functionalized, as indicated by a change in STM imaging resolution, it is still possible to transfer an off-apex hydrogen to the surface (type-II signature) without altering the apex itself (leaving the tip functionalized). That is, with a hydrogen-functionalized tip, it is not guaranteed to first remove the apex atom and observe a type-I HR signature, as an off-apex hydrogen may be more mobile and easily transferred to the surface first, causing a type-II HR signature. According to embodiments, the tip is unable to functionalize spontaneously with off-apex hydrogen. This observation is consistent with experimental imaging data, where spontaneous changes in image resolution with a tip suitable for HL/HR are rare.

With the ability to know when a tip is hydrogen-functionalized, and when the apex atom has been removed, it is now possible to correlate dI/dV spectroscopy curves over hydrogen terminated silicon with the specific tip states necessary for hydrogen transfer to occur (type-I). Given such a correlation, dI/dV spectroscopy provides a new, more rapidly acquirable metric to determine if the tip is suitable for HR. According to embodiments, these curves are then used as training data in the automated tip forming routine to always ensure the tip is in the required state, without the need to take an entire STM image.

Figure 4B:
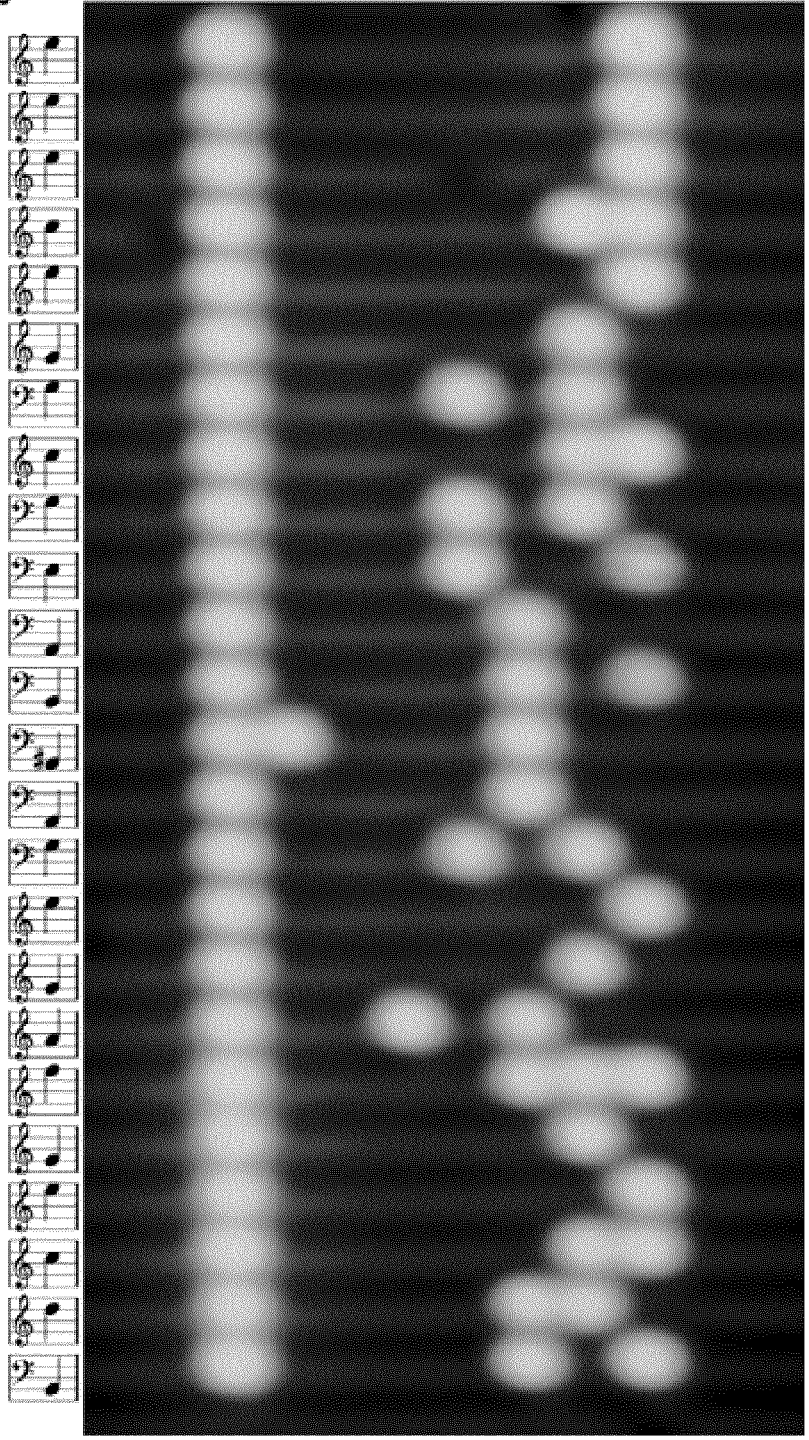
Figure 5A:
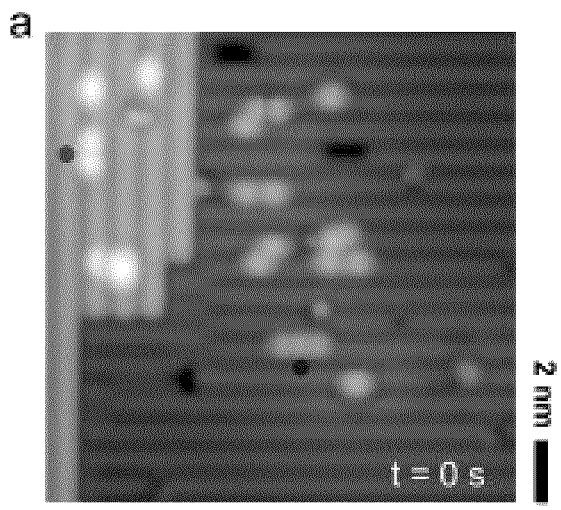
FIG. 5A is a (V=−1.8 V, I=50 pA, T=4.5 K, 15×15 nm$^2$) STM image of a deuterium-terminated Si(100)-2×1 surface, with various dangling bond (DB) structures.
Figure 5B:
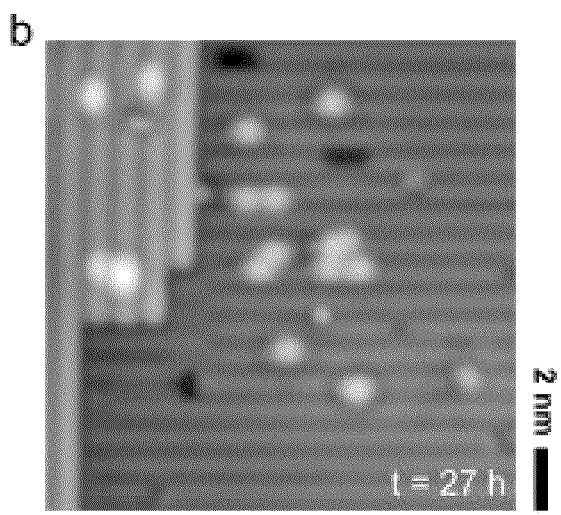
FIG. 5B is a (V=−1.8 V, I=50 pA, T=4.5 K, 15×15 nm$^2$) STM image of the same area as in FIG. 5A after 27 hours in an environment of 9·10$^{-11}$ Torr of hydrogen gas (negligible deuterium background), at each inter-dimer site, a hydrogen molecule has reacted and in the structure with three directly adjacent DBs, a hydrogen molecule reacted with two of the DBs, leaving an isolated DB remaining.
Figure 5C:
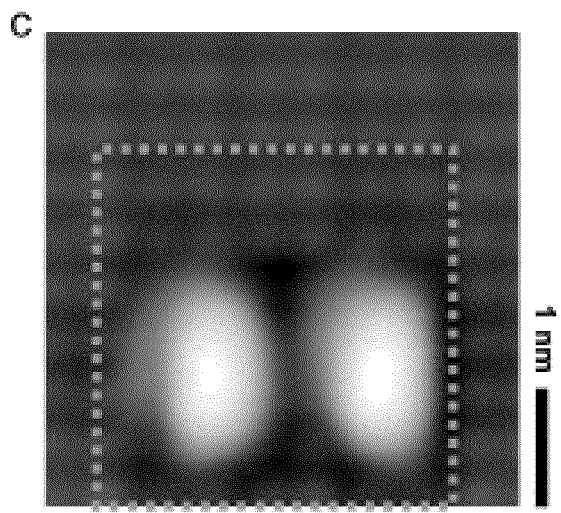
FIG. 5C is a (V=1.4 V, I=50 pA, T=4.5 K, 4×4 nm$^2$) STM image of two inter-dimer sites created on the deuterated surface, ready to react with an ambient hydrogen molecule.
Figure 5D:
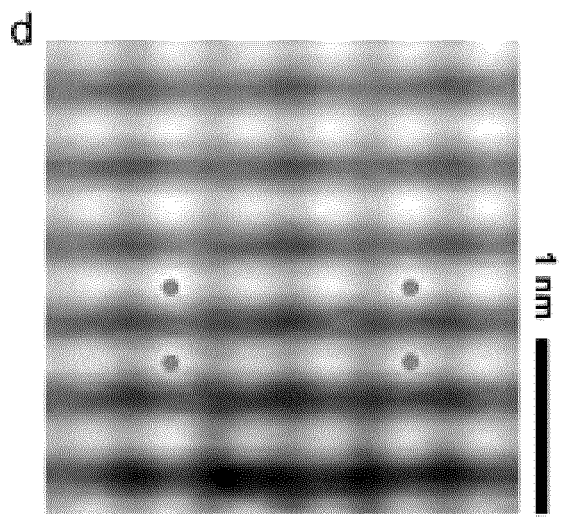
FIG. 5D is a (V=1.4 V, I=50 pA, T=4.5 K, 2.7×2.7 nm$^2$) STM image of the area highlighted in FIG. 5C after the reaction of two hydrogen molecules, with the present imaging techniques, the hydrogen and deuterium atoms could not be differentiated, and inelastic tunneling spectroscopy was also unable to resolve a discernible signal to identify the atoms, however, identification should be possible with other techniques such as AFM the present
Figure 5E:
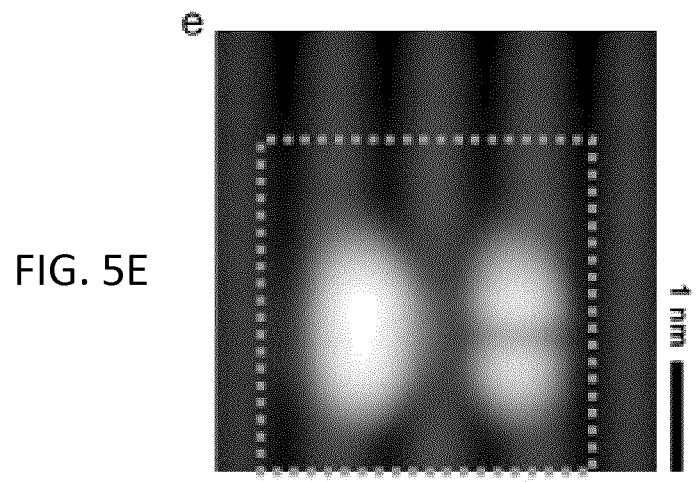
FIG. 5E is a (V=−1.8 V, I=50 pA, T=4.5 K, 4×4 nm$^2$) STM image showing filled states image of FIG. 5C.
Figure 5F:
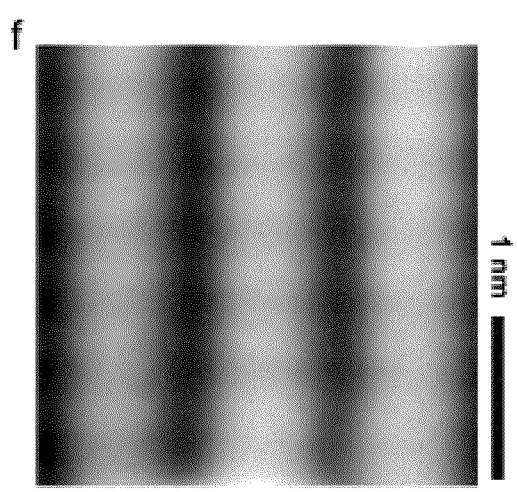
FIG. 5F is a (V=−1.8 V, I=50 pA, T=4.5 K, 2.7×2.7 nm$^2$) STM image showing filled states image of FIG. 5D.

According to embodiments, HL combined with HR is used to create two different working atomic-scale memories, as shown in FIGS. 4A and 4B. According to embodiments, a bit is defined with four lattice sites, giving a one atom buffer between neighbouring DBs, as shown in FIG. 1A. Due to the ideal geometry of the hydrogen-passivated Si(100)-2×1 surface, this arrangement yields an extremely high bit density of 1.70 bits per $nm^2$. Conservatively estimating a 20% reduction in storage density to integrate practical control architecture, this system still provides the highest density solid state storage medium available. According to embodiments, an 8-bit memory is used to sequentially encode the ASCII binary representation of each letter of the English alphabet, overwriting the previous letter each time, as shown in FIG. 4A. That is, FIG. 4A shows STM images of a rewritable 8-bit memory constructed from DBs. The DBs appear as bright protrusions in the images, the black defect at the left of each image is an area of missing silicon. The letters of the English alphabet were converted to their ASCII binary forms (e.g. A=01000001) and written to the same area using HL and HR techniques. An average of three bits could be repassivated sequentially between the letters shown. (V=−1.75 V, I=50 pA, T=4.5 K, 3.3×10 $nm^2$). Writing each letter takes between 10 and 120 seconds, depending on how many DBs needed to be created and repassivated. Random changes in the tip apex occur infrequently, altering HL and HR efficiencies, which are remedied through controlled contact of the STM tip with the surface to condition the apex structure. The HR stage is currently the slowest step, limited by the number of available hydrogen atoms on the surface of the tip. In some instances, moving away from the structure to reload the tip after repassivating several DBs introduces a significant delay. With structures requiring more DBs there will be a continued source of hydrogen to the tip as each new DB is created (equivalent to the reloading procedure). With enhanced automation to incorporate periodic intervals for HR/error correction during HL the need to travel away from the structure to reload the tip can be reduced or altogether eliminated. Further improvements to HR speeds are possible through tip materials like platinum, which is able to hold at least 1000 atoms of hydrogen on its surface.

According to embodiments, a larger 192-bit memory with the same bit density is created, encoding the iconic notes of the Mario videogame theme song. FIG. 4B shows an STM image of an expanded 192-bit memory, storing 24 notes (converted into binary) of the popular Mario videogame theme song. The notes consist of 62 DBs, forming the largest error-free DB structure to date. Both memories have a bit density of 1.70 bits/nm2and can be read directly from the STM or from a stored image. This 62 DB arrangement took 250 s to create, and represents a leap forward in HL capability. The 192-bit memory is read directly from the STM as the tip scans over the structure, or later from recorded images. DB structures are stable at room temperature. DBs on the surface of silicon are known to face barriers to diffusion in excess of 1.4 eV in either direction. Taking an exponential prefactor of $A=2·10^{14}$ $s^{-1}$ and the lowest energy barrier of 1.46 $eV^{13}$ (intradimer diffusion), a DB is expected to experience only one hop in over 500 years due to thermally activated processes at 300 K. Such stability and density make DB-based memories a unique candidate for data archival and long-term storage.

Held at 4.5 K no unintentional changes in the memory are detected at the end of six days of observation. In this environment, samples have shown no significant surface degradation after half a year. The ultra-high vacuum requirements can also be relaxed as isolated DBs can be protected against spontaneous reactions through the appropriate choice of doping level of the silicon substrate. Highly doped n-type silicon results in negatively charged DBs, which have a barrier to reaction with closed shell species. There is also only a subset of entities that are known to readily react with DBs. Molecular hydrogen, which is commonly present in vacuum environments, requires two directly adjacent DBs along a dimer row for adsorption, reducing the likelihood of spontaneous repassivation of isolated DBs at greater separations (as in the memory) due to ambient gas. The inability to eliminate all naturally occurring DBs during sample preparation in an environment of $1·10^{-6}$ Torr of hydrogen gas, or with intentional chemical dosing further supports this notion.

These new HL and HR techniques have immediate utility and applications by creating and editing large error-free DB structures through accessible STM based means. Both these techniques can be implemented on many STMs with no modifications, operating over a range of temperatures. Though the exact parameters reported here are specific to hydrogen-terminated silicon, they can be adapted to other chemically similar systems such as hydrogen terminated germanium, hydrogen-terminated diamond, and chlorine-terminated silicon. According to embodiments, these protocols extend to room temperature, as forms of HL have already been successfully demonstrated there, and the uncontrolled transfer of hydrogen from an STM tip to a DB has been observed for HR. However, fabricating structures/devices at cryogenic temperatures (where creep and thermal drift are not as pronounced) for use at room-temperature is already sufficient for many applications. Further, the high-temperature stability of DBs removes one of the logistical issues surrounding the transportation of fabricated nano-devices to an end user, regardless of the temperature required for their operation.

Together, HL and HR unlock an array of new possibilities including the creation of hundreds of precisely placed identical qubits for quantum computation, the realization of room-temperature stable atomic-scale memory, and the long sought-ability to controllably create regions with no DBs. HR also augments the yield of existing commercial fabrication methods for multi-atom-wide DB structures, where patterned edges are prone to errors. These HL/HR techniques play an integral role in accelerating the progress of many of the proposed disruptive technologies. Supported with methods of preserving the surface outside of vacuum, along with efforts in parallelizing scanned probe fabrication, these techniques provide the foundation for practical atomic-scale devices.

According to embodiments, the present disclosure provides, a method, working at 4.5-40 K, that enables the detection of charge changes in a selected area down to the single electron level on the surface of highly doped hydrogen-terminated silicon using an STM. Such sensitivity now allows for the determination of the number of charges in dangling bond (DB) structures created through hydrogen lithography on the surface in a straightforward manner. Once the number of charges in a given structure is known, such as in a tailored chemically reactive site, it is possible to sense a single molecule bonding event to the site, with reduced influence from the tip field. The event can be detected with a range of time resolution from coarse sampling to real time. Multiple bonding events can be observed as well. Reactive sites for the case of hydrogen molecule binding, showing three different reaction time-scales, allow for estimation of the pressure of hydrogen gas in the vacuum chamber. These specific sites can be used to spatially control where hydrogen reacts on the surface, as shown in FIGS. 5A-5F, enabling a new method (that is not limited by the number of adsorbed atoms on the STM probe) to rewrite atomic memory and repair fabrication errors in hydrogen lithography. Due to their charged nature, reactive sites such as these can also be directly integrated into field controlled atomic electronic circuitry designs, providing another route for sensing applications.

Single DBs on an otherwise hydrogen-passivated silicon surface introduce an isolated electronic state within the silicon bandgap. The current through a DB, as measured by an STM tip, can be influenced by the DB's local electrostatic environment, including by the charge state of subsurface dopants. Due to the sample preparation method there is a dopant depletion region extending over 60 nm from the surface, which largely isolates surface DBs and dopants in this layer from the bulk. At 4.5 K, dopant atoms laterally separated from the tip by up to 15 nm and at a depth of approximately 5 nm to 15 nm remain un-ionized (neutral) until a critical tip voltage (field) is reached. When one such dopant is field ionized by the tip, the now positive ion core causes downward bending of the local energy bands in such a way that a channel is opened between the bulk silicon conduction band and the DB, resulting in a large increase of current to the STM tip. This sudden turn-on of current manifests as a sharp step in the current-voltage (I/V) spectroscopy taken over the DB, as shown in FIG. 6F. It is possible to increase the value of the critical voltage by adding local negative charges on the surface so as to affect upward band bending, therefore requiring a larger tip field to achieve dopant ionization.

Figures 6A, 6B:
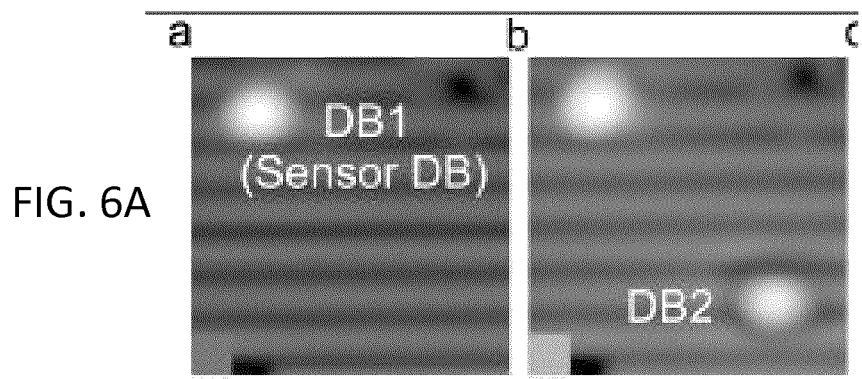
FIG. 6A is an STM image of a fabricated DB structure on the hydrogen-passivated Si(100)-2×1 surface exhibiting a sharp current onset in its I/V spectrum due to the ionization of a subsurface arsenic dopant atom caused by the STM tip field.
FIG. 6B is an STM image of a fabricated DB structure (V=−1.6 V, I=50 pA, T=4.5 K, 6.4×6.4 nm2) on the hydrogen-passivated Si(100)-2×1 surface exhibiting a second DB (DB2), containing a net charge of one electron added to the surface 5.4 nm away from DB1, causing the step in the I/V spectrum of DB1 of FIG. 6A to shift to the left.
Figures 6C, 6D:
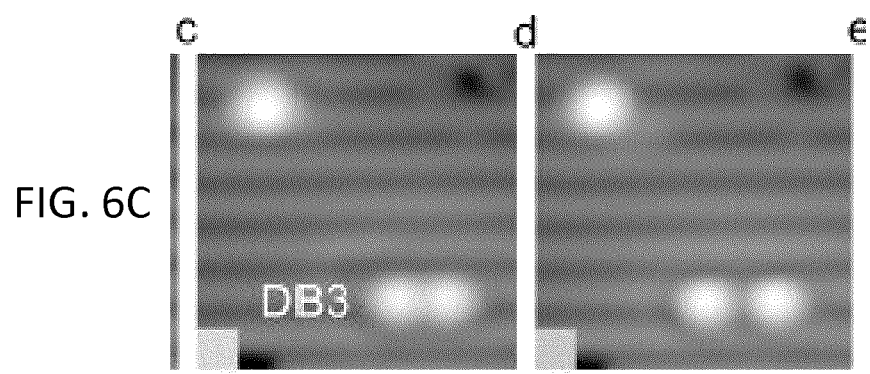
FIG. 6C is an STM image of a fabricated DB structure V=−1.6 V, I=50 pA, T=4.5 K, 6.4×6.4 nm2) on the hydrogen-passivated Si(100)-2×1 surface exhibiting a third DB (DB3) added near DB2 of FIG. 6B, no shift in the I/V spectrum of DB1 is observed.
FIG. 6D is an STM image of a fabricated DB structure (V=−1.6 V, I=50 pA, T=4.5 K, 6.4×6.4 nm2) wherein the distance between DB2 and DB3 is varied to determine the net charge in the structure for each case.
Figure 6E:
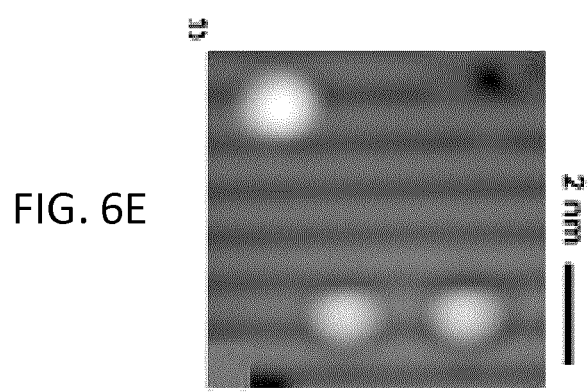
FIG. 6F is a graph showing a sharp step in the current-voltage (I/V) spectroscopy taken over the DBs of FIGS. 6A-6E.
Figure 6F:
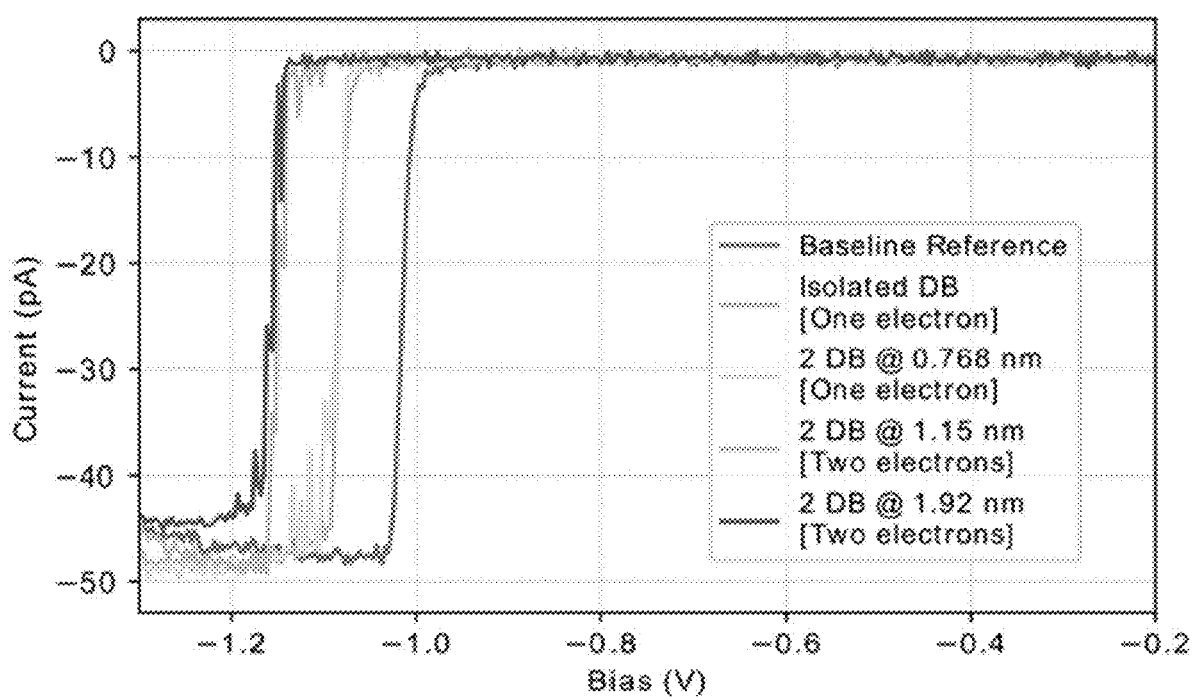

Embodiments of the present disclosure take advantage of this effect to provide an STM procedure to determine the amount of net charge in fabricated DB structures, as shown in FIGS. 6A-6E. On a highly arsenic doped hydrogen-terminated silicon surface, two closely spaced DBs are predicted to have a net charge of one electron between them, while two isolated DBs each have a net charge of one electron. Recent AFM experiments have verified the single net electron occupation of two closely spaced DBs, however, the analogous capability has been lacking in STM (principally because STM applies a large perturbative field while imaging). To determine the net charge in STM a control I/V spectrum over a sensor DB (DB1) is determined, which is preselected because it exhibits the sharp current onset due to the ionization of a nearby isolated arsenic dopant, as shown in FIG. 6A. Then a second isolated DB (DB2) is added 5.4 nm away (a distance known from AFM experiments to result in one electron at each DB), and a new spectrum is taken over DB1, as shown in FIG. 6B. The lateral separation between DB2 and DB1 significantly reduces the effects of the tip field and charge injection/extraction at DB2 while measurements are taken at DB1. The presence of the negatively charged DB2 increases the voltage onset of the current, shifting the step to the left, as shown in FIG. 6F. Another DB (DB3) is then added one lattice site away (0.768 nm) from DB2, as shown in FIG. 6C, and the measurement of DB1 is repeated once more. The presence of DB3 does not shift the spectrum. DB3 is then erased and recreated it with two lattice site separation (1.15 nm) from DB2, as shown in FIG. 6D. This time, the spectrum taken over DB1 showed an additional shift to the left. Repeating this process, DB3 is positioned four lattice sites (1.92 nm) from DB1, as shown in FIG. 6E, and no additional shifts in the current onset are observed in FIG. 6F.

Through these measurements, it is concluded that there is a significant decoupling of DB2 and DB3 by changing their separation from one lattice site to two. With one lattice site separating DB2 and DB3, the net charge contained within the structure is one electron. Once the spacing is increased to two or more lattice sites there is a net charge of two electrons within the structure/local area. According to embodiments, the un-ionized dopant is sufficiently deep that the change in lateral separation of the two DBs in the structure (DB2 and DB3) does not alter their distance to the dopant significantly, as the induced shifts from one and two electrons are not measurably different in the I/V spectrum, indicating that the un-ionized dopant is sufficiently deep, such that the change in lateral separation of the two DBs in the structure (DB2 and DB3) does not alter their distance to the dopant significantly.

With the ability to create and erase a number of isolated DBs in a particular area, the shifts in the I/V spectrum of a sensor DB can be calibrated in order to characterize the amount of net charge in larger DB structures, or after changes occur to a local area. Using this technique, it has also been determined that two directly adjacent DBs (an inter-dimer site), as shown in FIG. 7C, have a net charge of one electron, as shown in FIGS. 12A-12D. With reduced influence of the tip field at the sites of interest, this presents a powerful tool for performing AFM-like characterization and studies of charge occupation with only an STM. In closed cycle scanned probe systems, it is possible to observe the I/V step over a range of temperatures up to approximately 40 K, above which the dopants in the depleted region begin to thermally ionize.

Figure 7A:
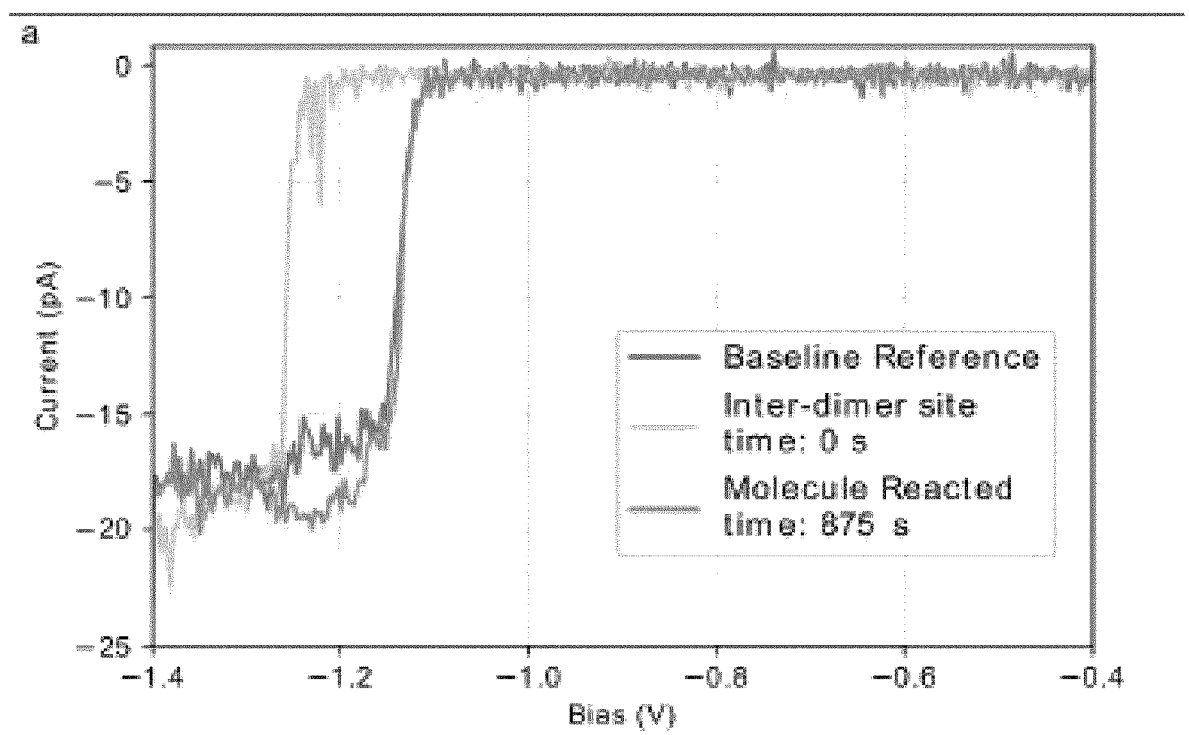
FIG. 7A is a graph showing the I/V spectra taken periodically over the sensor dangling bond (DB) associated with FIGS. 7B, 7D, and 7E.

Once the amount of charge in a particular reactive site is known, if there is a change of at least one electron locally when a molecule binds, then it is possible to use the sensing techniques described above to detect the event by periodically recording the I/V spectrum or rapidly sampling the current through a distant sensor DB. Different reactive sites are created for specific molecules. Such a technique is applied to investigate the effect of local defects (both charged and structural) on the bonding dynamics of molecules, where the reactive sites are otherwise identical. Hydrogen molecules are extremely reactive with the inter-dimer site, which has a net charge of one electron but has zero net charge when both DBs are repassivated with hydrogen atoms. FIGS. 7A-7E, show the observation/detection of a single hydrogen molecule bonding event. To detect the event, an inter-dimer site is created 10.2 nm (to again reduce the effect of the STM tip) from a DB that exhibited a sharp turn-on in its I/V spectrum, as shown in FIGS. 7A, 7B, and 7D. Hydrogen gas (H2) I then controllably leaked into the vacuum chamber at a pressure of $4 \cdot 10^{-7}$ Torr and recorded a spectrum over the DB at 35 s intervals. After 875 s has elapsed, the step in the I/V spectrum jumps back to its original position, as shown in FIGS. 7A and 7E, indicating that a single bonding event had occurred, and a hydrogen molecule reacted with the inter-dimer site sometime within the last 35 s time window.

Figure 8A:
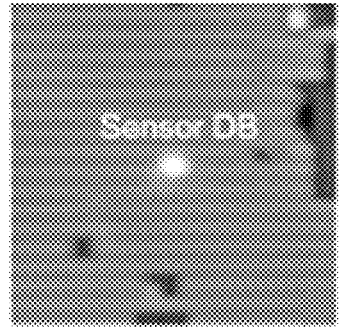
FIG. 8A is an STM image (V=−1.7 V, I=50 pA, T=4.5 K, 15×15 nm$^2$) of an isolated dangling bond (DB) on the hydrogen-passivated Si(100)-2×1 surface, which exhibits a sharp current onset in its I/V spectrum.
Figure 8B:
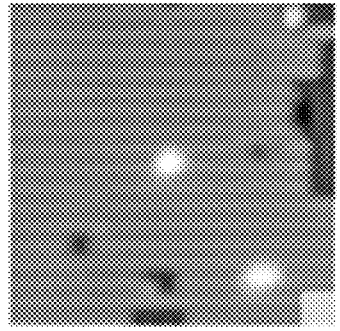
FIGS. 8B-8D are (V=−1.7 V, I=50 pA, T=4.5 K, 15×15 nm$^2$) STM images of a sequence of inter-dimer sites being added at various distances and locations relative to the sensor DB (6.6 nm, 8.9 nm, 8.4 nm)
Figure 8C:
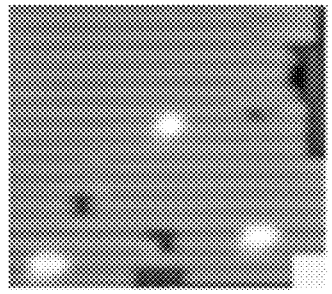
Figure 8D:
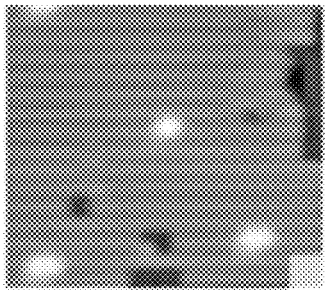
Figure 8E:
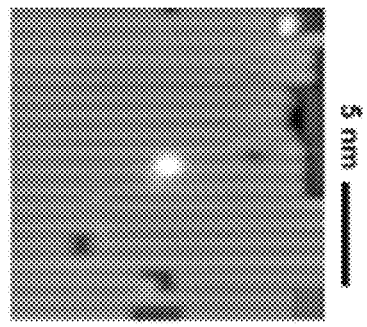
FIG. 8E shows an (V=−1.7 V, I=50 pA, T=4.5 K, 15×15 nm2) STM image taken 120 s after the creation of the inter-dimer site of FIG. 8D, before any additional hydrogen gas was added into the vacuum chamber.
Figure 8F:
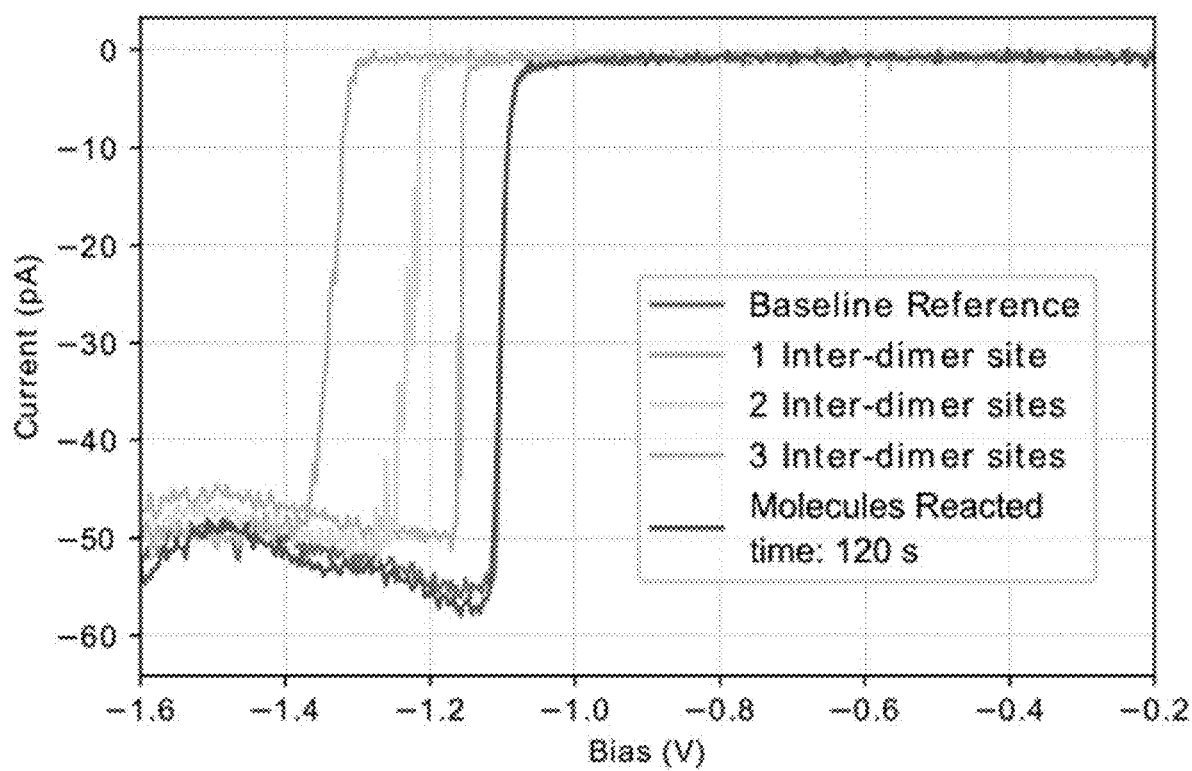
FIG. 8F shows a graph showing the I/V spectra taken over the sensor DB, associated with FIGS. 8A-8E.
Figures 9A, 9B, 9C:
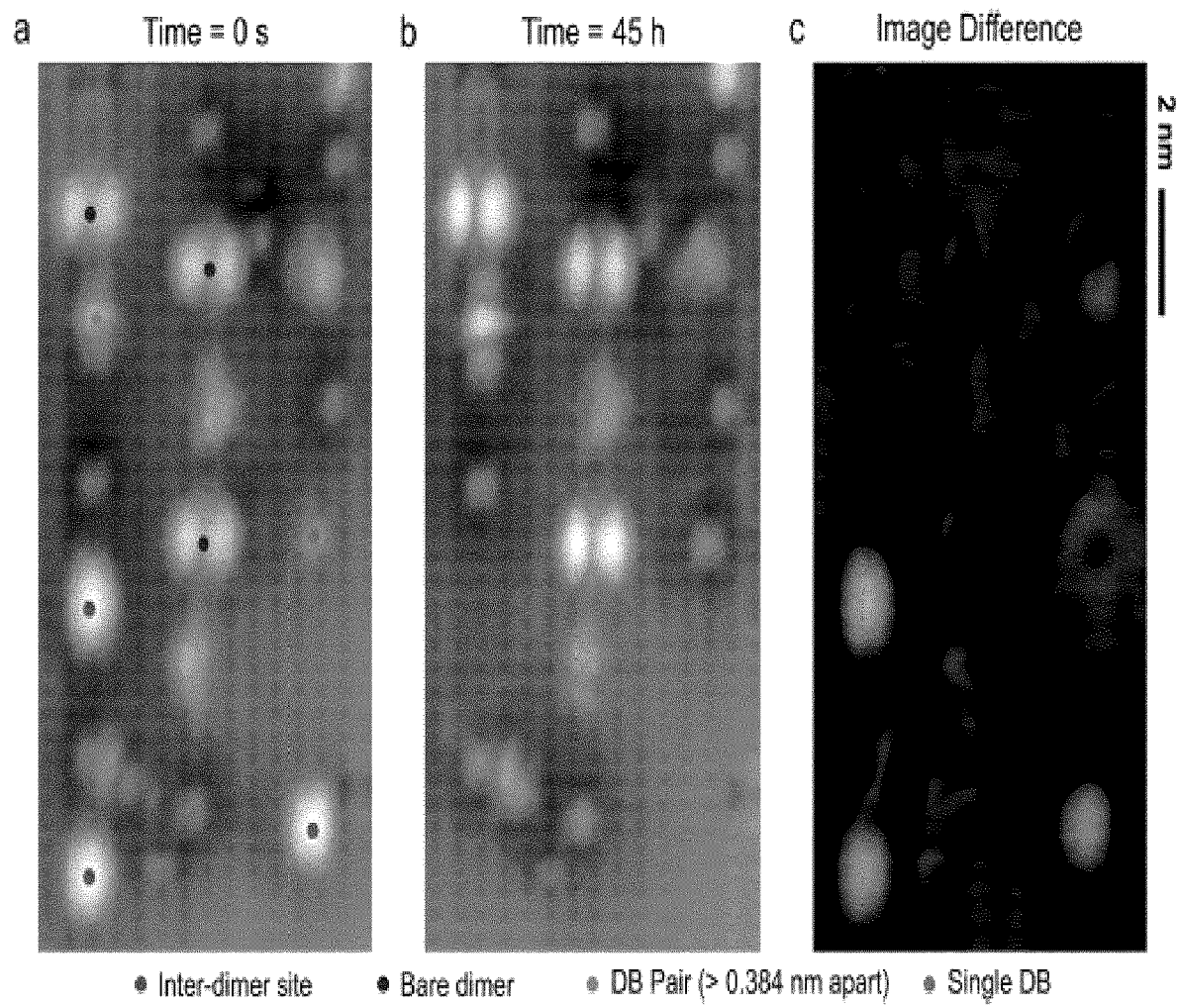
FIG. 9A is a (V=1.4 V, I=50 pA, T=4.5 K, 14×8 nm$^2$) STM image of an area where a number of various DB structures have been created with the inter-dimer sites denoted in red and the intra-dimer sites (bare dimers) denoted in blue.
FIG. 9B is a (V=1.4 V, I=50 pA, T=4.5 K, 14×8 nm$^2$) STM image of the same area of FIG. 9A after sitting in a vacuum chamber with a base pressure of 5·10$^{-11}$ Torr for 45 hours.
FIG. 9C is an STM image showing the difference between FIGS. 9A and 9B where only the inter-dimer sites have reacted after 45 hours, with no other significant changes occurring in this time with any of the isolated DBs or other DB structures.

The reactivity of hydrogen molecules with inter-dimer sites with different proximities to other DBs and defects were also explored, as shown in FIGS. 8A-8E and FIGS. 5A and 5B. No measurable effects on the reactivity during were observed during timescales of interest, instead finding it to be a very robust mechanism. The time for a hydrogen molecule to bind to an inter-dimer site depends on the pressure of hydrogen gas in proximity to the sample surface. Due to the design of the STM chamber, the measured pressure outside the cryo-shielding is not an entirely accurate representation of the actual pressure in the vicinity of the tip and sample. There is little flux of gas through the shielding, as well as the cold surfaces lower the pressure further through cryo-pumping effects. Using the observations of the reaction time of these sites, a bound on the pressure inside the shielding is estimated. A perfect sticking coefficient is assumed due to the barrierless nature of the reaction, along with the observation of the reaction at 4.5 K. Using more conventional sequential STM image acquisition to study slower dynamics, three inter-dimer sites are observed to react over 45 h, as shown in FIGS. 9A-9C, giving an estimated pressure of approximately $1 \cdot 10^{-11}$ Torr. With observations taken using the sensing technique after the introduction of H2 into the chamber, such as those shown in FIGS. 7A-7E, a local pressure of approximately $1 \cdot 10^{-9}$ Torr is estimated. In FIGS. 8A-8F, three inter-dimer sites are created 6.6 nm to 8.9 nm from a sensor DB exhibiting the characteristic current step, with the intention of detecting three sequential binding events. Each subsequent site shifted the step to higher voltages, as shown in FIG. 8F. The base-pressure near the sample is sufficiently high after earlier experiments that all three sites reacted before additional H2 is leaked in and monitoring is initiated (only 120 s after creating the third inter-dimer site). Including this observation, along with FIGS. 10A-10G a pressure of approximately $1 \cdot 10^{-8}$ Torr is estimated in the vacuum chamber.

The robust nature and speed of reaction of inter-dimer sites at an approximate pressure of $10^{-8}$ Torr, along with the lack of reactivity of other DB structures with hydrogen molecules, as shown in FIGS. 9A-9C, present an interesting opportunity to employ spatially controlled chemistry for technological applications. The present disclosure, employing advances in hydrogen lithography, provides for the erasure/repassivation of isolated DBs by bringing in individual hydrogen atoms bonded to the tip itself. Such techniques provide embodiments of rewritable ultra-dense information storage and atomic circuitry. One limitation of these techniques, however, is that they require the tip to gather hydrogen atoms from locations outside of the working area whenever they are needed. This can slow the fabrication process in certain cases and is one of the current rate-limiting factors in the rewriting speed of the atomic memory arrays. Therefore, instead of bringing in external hydrogen atoms on a probe for hydrogen repassivation, embodiments provide the use of ambient molecular hydrogen to achieve the same functionality.

To initiate molecular hydrogen repassivation (M-HR) an isolated DB, which needs to be erased, is converted into an inter-dimer site (by removing an additional atom from the surface). At sufficiently high hydrogen gas pressures, the site quickly reacts with an ambient hydrogen molecule to erase the site (including the original DB), as shown in FIGS. 10A-10F. The site in FIG. 10C reacted in between the acquisition of FIGS. 10C and 10D, taking less than 52 s. This "create-to-erase" style of error correction eliminates the need to bring in external hydrogen atoms for the vast majority of situations where erroneous DBs need to be corrected during fabrication. M-HR also has no limitation on the amount of hydrogen available for rewriting operations, as more gas can always be added into the chamber. In regard to the scalable automation of atomic-scale fabrication and rewriting memory arrays, using M-HR reduces the complexity for machine learning algorithms because there is no requirement to perform the difficult task of training neural networks to determine when a tip is loaded with hydrogen.

Figure 10A:
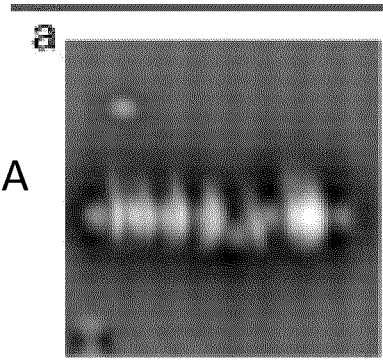
FIG. 10A is a (V=1.4 V, I=50 pA, T=4.5 K, 8×8 nm$^2$) STM image of an 8-bit dangling bond (DB) memory array, with a fabrication error, taken to visualize the location of the surface hydrogen atoms.
Figure 10B:
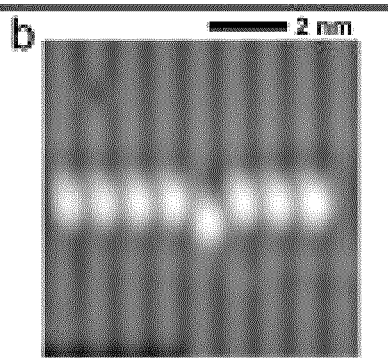
FIG. 10B is a (V=−1.6 V, I=50 pA, T=4.5 K, 8×8 nm$^2$) STM image of the same structure as in FIG. 10A, taken at a negative sample bias to better visualize the location of the DBs in the array.
Figure 10C:
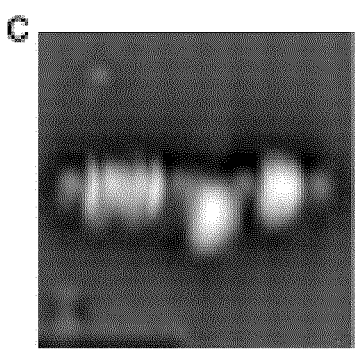
FIG. 10C is a (V=1.4 V, I=50 pA, T=4.5 K, 8×8 nm$^2$) STM image taken after the erroneous DB in FIG. 10A was converted into an inter-dimer site, by removing an additional hydrogen atom from the surface.
Figure 10D:
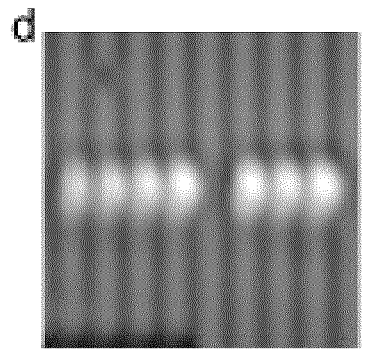
FIG. 10D is a (V=−1.6 V, I=50 pA, T=4.5 K, 8×8 nm$^2$) STM image taken immediately after the image of FIG. 10C (52 s later), during which time the inter-dimer site reacted with an ambient hydrogen molecule to erase the erroneous DB.
Figure 10E:
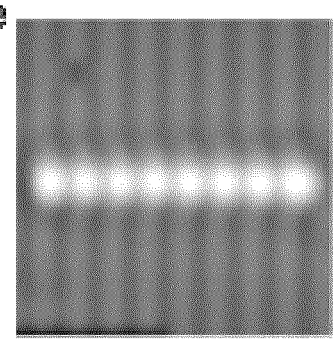
FIG. 10E is a (V=−1.6 V, I=50 pA, T=4.5 K, 8×8 nm$^2$) STM image showing the correct 8-bit memory array structure, after the removal of the correct hydrogen atom from the surface.
Figure 10F:
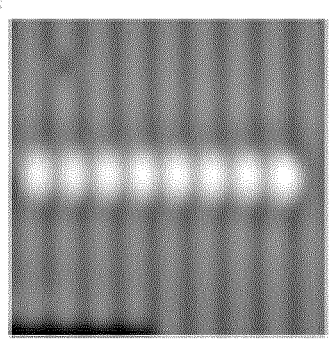
FIG. 10F is a (V=−1.6 V, I=50 pA, T=4.5 K, 8×8 nm$^2$) STM image of the same structure shown in FIG. 10E unchanged after 6 days in an environment of an estimated pressure of 1·10$^{-8}$ Torr of hydrogen gas.
Figure 10G:
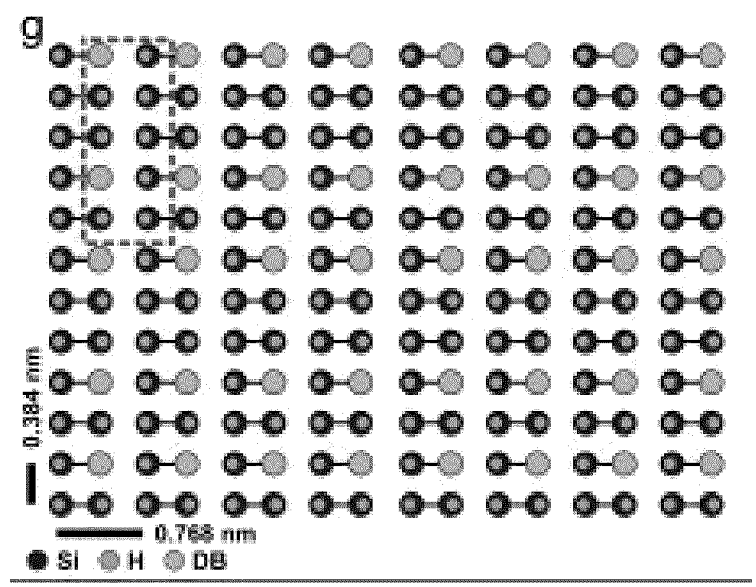
FIG. 10G is a design for a new ultra-dense memory array according to embodiments, with a maximum density of 1.36 bits per nm$^2$, which allows each bit on the surface to be converted into an inter-dimer site for molecular hydrogen rewriting operations.
Figure 12A:
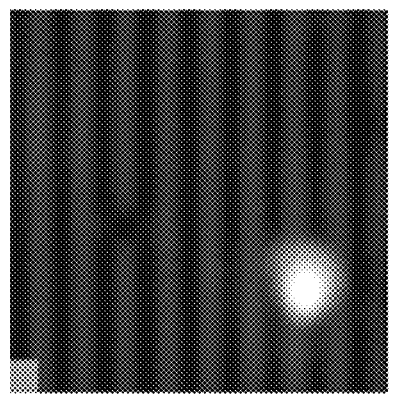
FIG. 12A is a (V=−1.8 V, I=50 pA, T=4.5 K, 8×8 $nm^2$) STM image of a dangling bond (DB) on the hydrogen-passivated Si(100)-2×1 surface, exhibiting a sharp current onset in its I/V spectrum due to the ionization of a subsurface arsenic dopant atom caused by the STM tip field, making it suitable to act as a charge sensor.
Figure 12B:
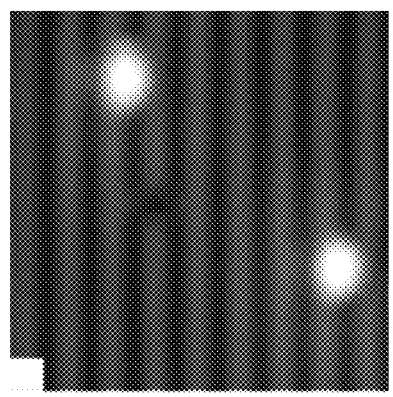
FIG. 12B is a (V=−1.8 V, I=50 pA, T=4.5 K, 8×8 $nm^2$) STM image of a second DB, containing a net charge of one electron is added to the surface to calibrate the sensor.
Figure 12C:
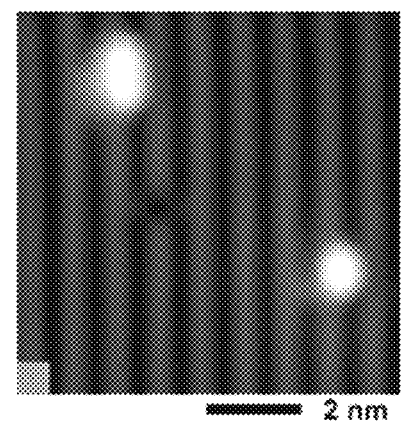
FIG. 12C is a (V=−1.8 V, I=50 pA, T=4.5 K, 8×8 nm2) STM image of the DB in FIG. 12B converted into an inter-dimer site.
Figure 12D:
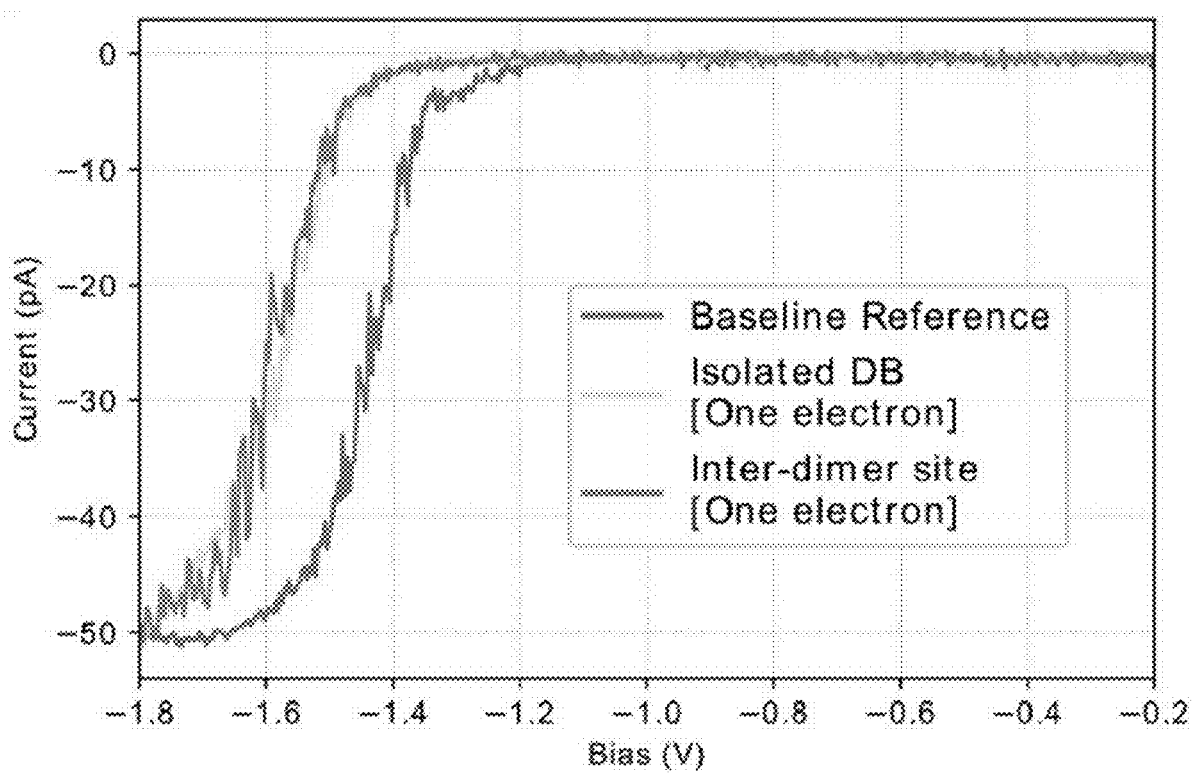
FIG. 12D is graph showing the I/V spectra taken over the first DB, associated with FIGS. 12A-12C, showing the sharp onset of current shift.

In situations where it is not possible to convert an erroneous DB into an inter-dimer site, the existing repassivation techniques can still be used to compliment M-HR, providing a more complete and efficient fabrication toolset. Furthermore, the reaction of hydrogen with inter-dimer sites has been observed at room temperature, making it a viable tool for hydrogen lithography in non-cryogenic conditions as well. Working at higher hydrogen pressures does not impact the stability of the structures fabricated from DBs. FIG. 10F shows the same structure in FIG. 10E unchanged six days later in an environment of $\sim 10^{-8}$ Torr.

According to embodiments, ultra-dense memory incorporates the M-HR mechanism as the primary means of rewriting the stored information as shown in FIG. 10G and FIGS. 11A-11C, while retaining the excellent thermal stability of the original scheme. Each bit can now be converted into an inter-dimer site to be rewritten as needed, unlike in the original implementation, as shown in FIG. 11A. The alteration in design reduces the maximum storage density from 1.695 bits/nm$^2$ to 1.356 bits/nm$^2$. This slight sacrifice in maximum storage density is compensated for with the potential speed increases to rewriting multiple bits (without needing to load an STM tip with hydrogen atoms). Additionally, according to embodiments, there is now an unlimited supply of molecules for write/rewrite cycles. As electron beam-based fabrication techniques become increasingly capable of imaging and manipulating single atoms, it is conceivable that one day the STM probe used to remove hydrogen atoms from the silicon surface will be replaced. Should such a transition occur for the removal of atoms, M-HR presents the ability to add material back in a controlled manner, with the prospect of completely probe-free writing/rewriting for data storage applications.

EXAMPLES

A commercial low-temperature Omicron LT-STM operating at 4.5 K to 77 K is used for measurements. The base pressure inside the STM ranges from $3 \cdot 10^{-11}$ to $7 \cdot 10^{-11}$ Torr. The STM tips consist of a polycrystalline tungsten wire (50 μm diameter), electrochemically etched in a solution of 2 M NaOH. The tips are then processed under ultra-high vacuum (UHV) conditions to further clean and sharpen them.

Samples are prepared by degassing a highly arsenic-doped Si(100) (0.003-0.004 ohm-cm) sample at 600° C. in UHV for 24 h to remove any adsorbed water. The samples are then resistively heated via rapid flashes to 1250° C. several times to remove all native oxide. Following that, each sample is exposed to $1 \cdot 10^{-6}$ Torr of 99.999% pure hydrogen gas (or 99.7% pure deuterium gas), flowed through a liquid nitrogen trap. A nearby tungsten filament held at 1900° C. is used to crack the gas into atomic hydrogen. Each sample is exposed to the gas for 120 s with no heating, then rapidly flashed it to 1250° C., after which the temperature is quickly brought down to 330° C. for 150 s to achieve the desired hydrogen-terminated 2×1 surface reconstruction. According to embodiments, the samples remain in the preparation chamber for up to 15 minutes as the pressure slowly returns towards the initial base pressure.

An HL program is designed, including a graphical user interface (GUI) for atomic pattern input. An artifact-free positive sample voltage STM image of the working area is first analyzed to determine the position of each atom through a 2D-Fourier Transformation (2DFT), extracting the dominant spatial frequencies of the surface from the power spectrum. This method accounts for nonlinearities in the STM motors as each directional motor (x and y) may have slightly different responses to an applied voltage, which can be recovered in the spatial frequencies. Additionally, the angle of each sample may differ slightly, and this information is also present within these 2DFT data. After the surface is characterized, a desired device design or pattern may be input via the GUI to be mapped onto the surface. Once a pattern has been mapped onto each hydrogen atom the HL procedure initiates. With the STM feedback controls on (I=50 pA, V=1.4 V) the tip is brought over the first site in the pattern. The feedback controls are then suspended, fixing the tip-height over the site. The tunneling current is recorded for reference, and ~20 ms voltage pulses are applied in the range of 1.8 to 3.0 V. The number of attempts (N) at each voltage, and the voltage increment can be set beforehand. Typical values are N=10 with a 0.01 V increment. During the voltage pulse phase, the tunneling current is sampled immediately after each applied pulse and compared to the reference value. If the measured current is 60% larger than the reference value, it is deemed a successful hydrogen removal event. With this technique false detections have been brought well below 0.5%, with most fabrication runs producing no false detections. After a successful hydrogen removal, or after the maximum number of pulses has been reached (unsuccessful removal) the feedback controls are restored, and the tip is brought to the next site in the pattern (following a raster path) where the process repeats.

In an effort to better control drift and creep, after a set number of HL events a routine can be called to check tip alignment with a reference STM image. If any misalignment is detected, the remaining pattern is shifted appropriately so the next locations for atom removal are again centered over their corresponding atom. The patterning-realignment cycle can continue until the pattern is complete. The image realignment can detect sub-nanometer shifts between images.

The tip is set directly over the lattice site where a DB is present (I=50 pA, V=1.4 V). The feedback controls are switched off, locking the tip-height. The sample voltage is changed to a value between 100 mV and 1.0 V, and then the tip is moved linearly towards the sample surface while recording the tunneling current. After the tip has traveled a distance of 550 pm towards the surface it is retracted to its original position. The original parameters are re-established, and the feedback control is restored. No significant correlation between voltage and HR efficiency is observed. The choice of voltage serves to limit the tunneling current to within ranges that prevent significant tip apex changes, while still providing adequate feedback signals. Typically, HR is performed at a bias of 200 mV and this value is only adjusted in the program when the signal falls outside of the desired range (3 pA to 300 pA). The strength of the signatures depends on the exact structure of the apex, as they can vary by an order of magnitude at the same applied bias. Even though the strength of the signatures varies, their shape remains characteristic, making them ideal for the detection of successful events. If the initial HR attempt is unsuccessful, the process can be repeated until a type-I or type-II signature is detected. According to embodiments, this includes automatic error detection after HL using image recognition to define arbitrary groups of sites for HR in an image. This enables fully automated HR, without any user intervention to select individual sites to initiate the HR process.

The memory readout is accomplished with the use of Python and Open CV. The periodicity of the hydrogen-terminated Si(100)-2×1 surface allows for a grid to be defined over the surface, where each bit is contained within one cell. The image contrast of when a DB is present or not lends to threshold detection to determine if the bit is one or zero. Memories can be read directly from recorded STM images, or as the image is built up while the STM scans over the surface, populating each cell element. Readout speed is limited by the maximum STM scan speed. The musical playback is created with the use of the Pygame package, where detected bit patterns can be mapped into notes for playback.

Once a sensor DB is identified, the baseline I/V spectrum is recorded, and the desired number of inter-dimer sites are created. The STM tip is then positioned over the sensor DB and the measurement program is initiated to periodically record the I/V spectrum. 99.999% pure hydrogen gas is then introduced into the system until a pressure of $4 \cdot 10^{-7}$ Torr was achieved, via a manual leak valve (the initial base pressure inside of the STM is $5 \cdot 10^{-11}$ Torr). The time interval is selected such that the entire I/V spectrum of the sensor DB could be recorded (both forward and backward sweeps), and the hydrogen gas pressure could be manually corrected in between measurements. The time window also provided sufficient delay for the majority of the mechanical vibrations of the STM tip due to the manual actuation of the leak valve to dissipate before each spectrum was acquired. To undertake real time measurements, where the acquisition of the full spectrum is not required, the tip is instead be held at a fixed voltage over the sensor DB. The bonding event then manifests as a jump in the STM tunneling current used for feedback control. In the case of the sensor DB shown in FIG. 7A, the tip is held at a voltage of 1.2 V. The jump in tunneling current can be detected in an identical way to the detection of changes in current used in hydrogen lithography, with a maximum sampling rate of 10 kHz.

In conclusion, the present disclosure demonstrates that a feature, caused by the ionization of a buried dopant atom, in the current-voltage spectrum taken over a DB on the surface of hydrogen-terminated silicon can be used to detect charge changes in a local area down to a single electron level. With this technique the AFM result it is verified, using an STM only, that two DBs separated by less than or equal to 1 lattice site have a net charge of one electron, while the same two DBs separated by greater than or equal to 2 lattice sites have a net charge of two electrons. Additionally, specific reactive sites are fabricated on the surface, which readily bond with hydrogen molecules (inter-dimer sites). Multiple bonding events of hydrogen molecules occur at these sites on the surface, with reduced influence from the STM tip. These techniques can be applied to study the dynamics of other tailored reactive sites for molecules that are of technological interest, or for fundamental studies of the effects of local defects on reaction dynamics. They may also be applied in closed cycle scanned probe systems over a range of temperatures up to ~40 K, above which the dopants in the depleted region begin to no longer be frozen-out. The ability to create sites tailored for hydrogen molecules is also employed as a new means to correct fabrication errors in hydrogen lithography. A new design of an atomic memory is also provided herein, integrating these techniques to greatly improve the rewriting speeds and overall usability. The charged reactive sites can also be directly integrated into field-controlled atomic circuitry designs, which presents yet another avenue of incorporating molecular sensing into electronics.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient roadmap for implementing the exemplary embodiment or exemplary embodiments. It should be understood that various changes may be made in the function and arrangement of elements without departing from the scope as set forth in the appended claims and the legal equivalents thereof.

CITED REFERENCES

Kalff, F. E. et al. A kilobyte rewritable atomic memory. *Nat. Nanotechnol.* 11, 926-929 (2016).

McEllistrem, M., Allgeier, M. & Boland, J. J. Dangling Bond Dynamics on the Silicon (100)-2×1 Surface: Dissociation, Diffusion, and Recombination. *Science* 279, 545-548 (1998).

Schwalb, C. H., Dürr, M. & Höfer, U. High-temperature investigation of intradimer diffusion of hydrogen on Si(001). *Phys. Rev. B* 82, 193412 (2010).

The invention claimed is:

1. An atomic orbital based memory storage comprising:
   a plurality of surface atoms forming dangling bonds (DBs); and
   a subset of said plurality of surface atoms passivated with spatial control to form covalent bonds with hydrogen, deuterium, or a combination thereof;
   wherein the atomic orbital based memory storage is a long-term static memory storage and wherein a unit of rewriteable memory ranges from 8-bit to 192-bit inclusive.

2. The memory storage of claim 1 the surface atoms are silicon atoms.

3. The memory storage of claim 1 the surface atoms are at least one of: germanium, diamond, graphite, graphene, GaAs, InSb, transition metal chalcogenide, and thin insulator-on-conductor, and thin insulator-on-semiconductor.

4. The memory storage of claim 1 wherein the covalent bonds are only formed with hydrogen.

5. The memory storage of claim 1 wherein a unit of rewriteable memory is 8-bit.

6. The memory storage of claim 1 wherein the covalent bonds are formed with both hydrogen and deuterium.

7. The memory storage of claim 1 further comprising a passivating overlayer to create archival stable storage.

8. The memory storage of claim 1 wherein the bit density is 1 to 25 bits per nanometers squared or greater.

9. A method of forming and reading an atomic orbital data storage comprising:
   selectively removing covalent bonds to form dangling bonds (DBs) extending from a surface atom by hydrogen lithography; and
   imaging the covalent bonds spatially to read the atomic orbital data storage.

10. The method of claim 9 wherein the covalent bonds are silicon atoms.

11. The method of claim 9 wherein the covalent bonds are between one of the surface atoms and hydrogen.

12. The method of claim 9 wherein the covalent bonds are between one of the surface atoms and deuterium.

13. The method of claim 9 wherein the imaging is performed by scanning tunneling microscopy.

14. The method of claim 9 further comprising selectively forming a covalent bond from a DB by hydrogen repassivation.

15. The method of claim 14 wherein said hydrogen repassivation is automated.

16. The method of claim 15 wherein automated hydrogen repassivation includes accomplished by any of an AFM-tip apex functionalized with H, an STM tip apex functionalized with H, an STM non-apex tip region loaded with H, a probe-free molecular method, or a combination thereof.

17. The method of claim 9 wherein said hydrogen lithography is automated.

18. An atomic orbital based memory storage comprising:
   a plurality of surface atoms forming dangling bonds (DBs);
   a subset of said plurality of surface atoms passivated with spatial control to form covalent bonds with hydrogen, deuterium, or a combination thereof; and
   a passivating overlayer to create archival stable storage;
   wherein the atomic orbital based memory storage is a long-term static memory storage.

19. The memory storage of claim 18 the surface atoms are silicon atoms.

20. The memory storage of claim 18 the surface atoms are at least one of: germanium, diamond, graphite, graphene, GaAs, InSb, transition metal chalcogenide, and thin insulator-on-conductor, and thin insulator-on-semiconductor.

21. The memory storage of claim 18 wherein the covalent bonds are only formed with hydrogen.

22. The memory storage of claim 18 wherein a unit of rewriteable memory is 8-bit.

23. The memory storage of claim 18 wherein a unit of rewriteable memory ranges from 8-bit to 192-bit inclusive.

24. The memory storage of claim 18 wherein the covalent bonds are formed with both hydrogen and deuterium.

25. The memory storage of claim 18 wherein the bit density is 1 to 25 bits per nanometers squared or greater.

* * * * *